(12) United States Patent
Nemoto et al.

(10) Patent No.: US 11,495,874 B2
(45) Date of Patent: Nov. 8, 2022

(54) ANTENNA MODULE AND METHOD FOR INSPECTING ANTENNA MODULE

(71) Applicant: Murata Manufacturing Co., Ltd., Kyoto (JP)

(72) Inventors: Takaya Nemoto, Kyoto (JP); Kaoru Sudo, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 231 days.

(21) Appl. No.: 16/837,375

(22) Filed: Apr. 1, 2020

(65) Prior Publication Data

US 2020/0227832 A1     Jul. 16, 2020

Related U.S. Application Data

(63) Continuation of application No. PCT/JP2018/028714, filed on Jul. 31, 2018.

(30) Foreign Application Priority Data

Oct. 3, 2017 (JP) .............................. JP2017-193499

(51) Int. Cl.
*H01Q 9/04* (2006.01)
*H01Q 5/378* (2015.01)
(Continued)

(52) U.S. Cl.
CPC ............ *H01Q 1/2283* (2013.01); *G01R 31/54* (2020.01); *H01Q 1/48* (2013.01); *H01Q 5/378* (2015.01); *H01Q 9/0435* (2013.01)

(58) Field of Classification Search
CPC ........ H01Q 1/2283; H01Q 5/378; H01Q 1/48; H01Q 9/0435; H01Q 9/0414; H01Q 21/065; H01Q 1/38; H01Q 3/267; G01R 31/54

See application file for complete search history.

(56) References Cited

U.S. PATENT DOCUMENTS 4,115,782 A * 9/1978 Han .................... H01Q 19/17
                                                              343/781 P
4,442,437 A * 4/1984 Chu .................... H01Q 13/025
                                                              343/786
(Continued)

FOREIGN PATENT DOCUMENTS

CN        207460167 U  *  6/2018
DE        10334061 A1  *  3/2005 ............. E05B 49/00
(Continued)

OTHER PUBLICATIONS

International Search Report for International Application No. PCT/JP2018/028714 dated Oct. 2, 2018.
(Continued)

*Primary Examiner* — Graham P Smith
*Assistant Examiner* — Jae K Kim
(74) *Attorney, Agent, or Firm* — Pearne & Gordon LLP

(57) ABSTRACT

An antenna module includes a base member, an antenna that includes a radiating element disposed in or on the base member, first and second feed lines each of which is connected to the radiating element, and a control circuit that is connected to the radiating element via the first feed line and the second feed line. The control circuit includes a signal processing circuit that is connected to the antenna via the first feed line and the second feed line and an antenna inspection circuit that checks an electrical conductivity of an electrical conduction path connecting the first feed line, the radiating element, and the second feed line to one another.

8 Claims, 20 Drawing Sheets

(51) Int. Cl.
*H01Q 1/48* (2006.01)
*H01Q 1/22* (2006.01)
*G01R 31/54* (2020.01)

(56) References Cited

U.S. PATENT DOCUMENTS

| | | | | |
|---|---|---|---|---|
| 4,623,894 A * | 11/1986 | Lee | ............ | H01Q 21/061 343/727 |
| 4,783,639 A * | 11/1988 | Hudspeth | ............ | H01P 1/2138 333/135 |
| 5,003,321 A * | 3/1991 | Smith | ............ | H01P 1/161 343/781 R |
| 5,410,318 A * | 4/1995 | Wong | ............ | H01Q 3/06 342/359 |
| 5,461,394 A * | 10/1995 | Weber | ............ | H01Q 13/0258 343/837 |
| 6,473,053 B1 * | 10/2002 | Krishmar-Junker | ..... | H01Q 5/55 343/756 |
| 6,593,893 B2 * | 7/2003 | Hou | ............ | H01Q 19/08 343/756 |
| 6,700,548 B1 * | 3/2004 | Chen | ............ | H01Q 5/45 333/135 |
| 2002/0000945 A1 | 1/2002 | Amyotte | ............ | H01Q 13/025 343/786 |
| 2006/0125706 A1 * | 6/2006 | Amyotte | ............ | H01Q 13/0208 343/786 |
| 2007/0075909 A1 * | 4/2007 | Flynn | ............ | H01Q 19/132 343/840 |
| 2008/0062036 A1 * | 3/2008 | Funk | ............ | E21B 49/00 342/22 |
| 2008/0207200 A1 * | 8/2008 | Fein | ............ | H04B 1/38 455/426.1 |
| 2009/0295660 A1 * | 12/2009 | Xu | ............ | H01Q 1/243 343/753 |
| 2010/0045554 A1 * | 2/2010 | Xu | ............ | H01Q 15/0086 343/753 |
| 2010/0141543 A1 * | 6/2010 | Parekh | ............ | H01P 1/161 333/135 |
| 2010/0231470 A1 * | 9/2010 | Lee | ............ | H01Q 15/0086 216/13 |
| 2010/0259346 A1 * | 10/2010 | Runyon | ............ | H01Q 21/24 333/248 |
| 2011/0156963 A1 * | 6/2011 | Rajgopal | ............ | H01Q 15/0086 343/702 |
| 2011/0181479 A1 * | 7/2011 | Martin | ............ | H01Q 13/025 343/756 |
| 2011/0205136 A1 * | 8/2011 | Runyon | ............ | H01Q 5/00 343/786 |
| 2013/0138260 A1 * | 5/2013 | Divan | ............ | H02J 3/16 700/298 |
| 2013/0173078 A1 * | 7/2013 | Divan | ............ | H02J 3/1864 700/295 |
| 2014/0145891 A1 * | 5/2014 | Palevsky | ............ | H01Q 9/0435 343/746 |

FOREIGN PATENT DOCUMENTS

| | | | | |
|---|---|---|---|---|
| DE | 102019200603 B3 * | 7/2020 | ............ | B60L 53/124 |
| JP | 2003-234000 A | 8/2003 | | |
| JP | 2006-154923 A | 6/2006 | | |
| JP | 2013-118594 A | 6/2013 | | |
| JP | 2014-011746 A | 1/2014 | | |
| JP | 2016-072654 A | 5/2016 | | |
| WO | 2013/065410 A1 | 5/2013 | | |

OTHER PUBLICATIONS

Written Opinion for International Application No. PCT/JP2018/028714 dated Oct. 2, 2018.

* cited by examiner

ANTENNA MODULE AND METHOD FOR INSPECTING ANTENNA MODULE

This is a continuation of International Application No. PCT/JP2018/028714 filed on Jul. 31, 2018 which claims priority from Japanese Patent Application No. 2017-193499 filed on Oct. 3, 2017. The contents of these applications are incorporated herein by reference in their entireties.

BACKGROUND

Technical Field

The present disclosure relates to an antenna module and a method of inspecting an antenna module.

Patent Document 1 describes a communication device that includes an antenna member and a method for checking a communication device. The communication device described in Patent Document 1 includes an antenna conductor and an antenna terminal connected to the antenna conductor. The antenna conductor is covered with a coating layer. The antenna terminal is a terminal that is not covered with the coating layer and that is used for an electrical conductivity check. The communication device described in Patent Document 1 performs an electrical conductivity check as an inspection of the communication device by bringing a probe into contact with the antenna terminal and a ground terminal.

Patent Document 1: Japanese Unexamined Patent Application Publication No. 2014-11746

BRIEF SUMMARY

In the method for checking electrical conductivity that is described in Patent Document 1, it is necessary to bring a probe into contact with each antenna terminal, and for example, in the case of inspecting a large number of communication devices or in the case where a communication device includes a large number of antenna conductors, it may not be easy to perform electrical conductivity checks.

The present disclosure provides an antenna module on which an electrical conductivity check can be easily performed and a method for inspecting an antenna module.

An antenna module according to an aspect of the present disclosure includes a base member, an antenna that includes a radiating element disposed in or on the base member, a first feed line and a second feed line that are connected to the radiating element, and a control circuit that is connected to the radiating element via the first feed line and the second feed line. The control circuit includes a signal processing circuit that is connected to the antenna via the first feed line or the second feed line and an antenna inspection circuit that checks an electrical conductivity of an electrical conduction path connecting the first feed line, the radiating element, and the second feed line to one another.

According to an antenna module and a method for inspecting an antenna module of the present disclosure, an electrical conductivity check can be easily performed.

DETAILED DESCRIPTION

Embodiments of the present disclosure will be described in detail with reference to the drawings. The present disclosure is not limited to the contents that are described in the following embodiments. Components that will be described below include components that can be easily considered by those skilled in the art, components that are substantially the same with each other, and components that are so-called equivalents. In addition, the components that will be described below can be suitably combined. Furthermore, there is a case where some of the components are not used.

First Embodiment

Figure 1:
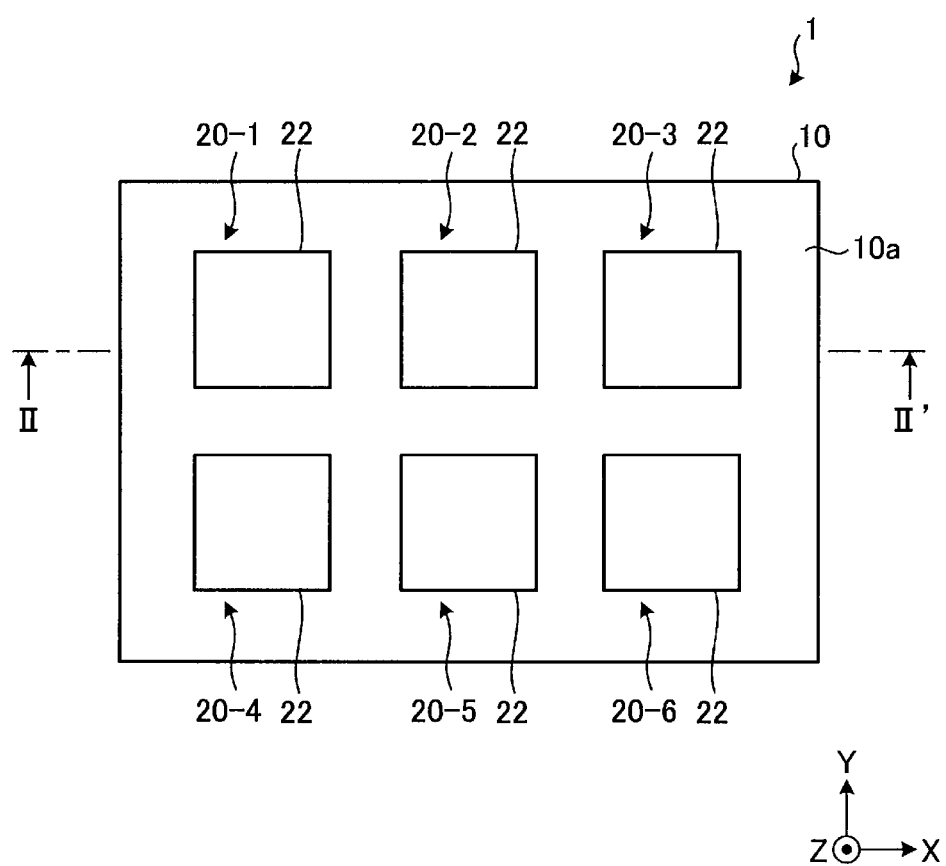
FIG. 1 is a plan view of an antenna module according to a first embodiment.
Figure 2:
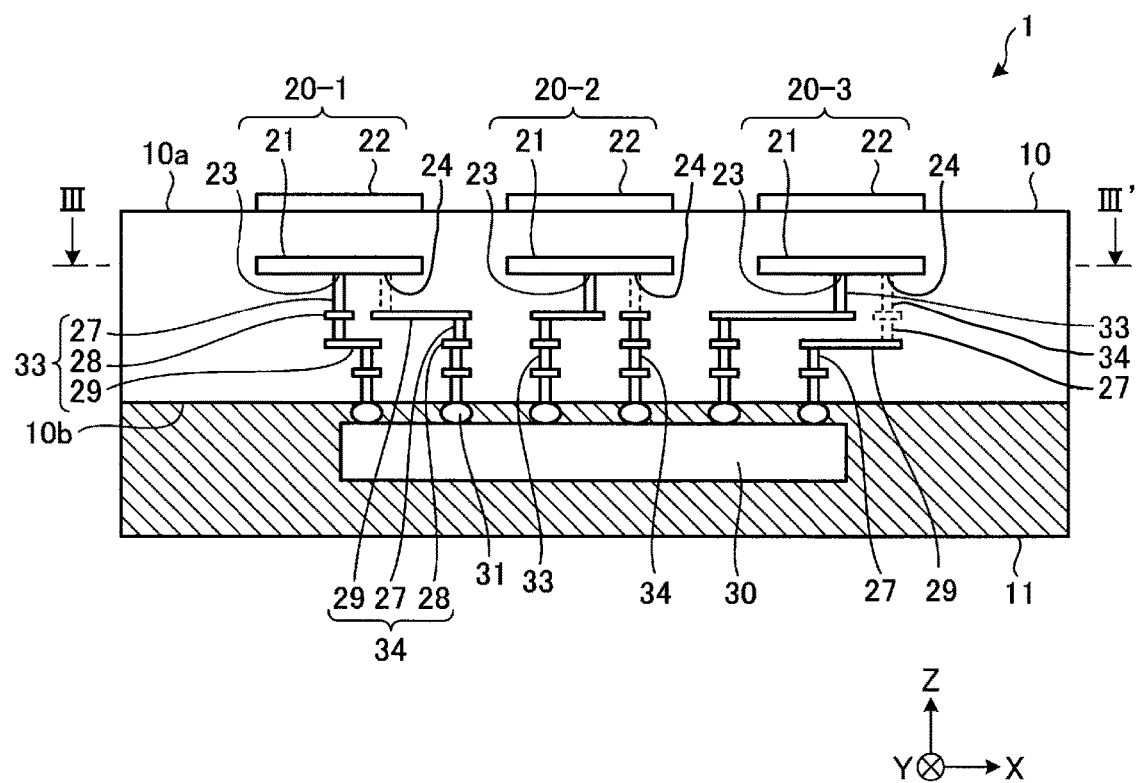
FIG. 2 is a sectional view taken along line II-II' of FIG. 1.
Figure 3:
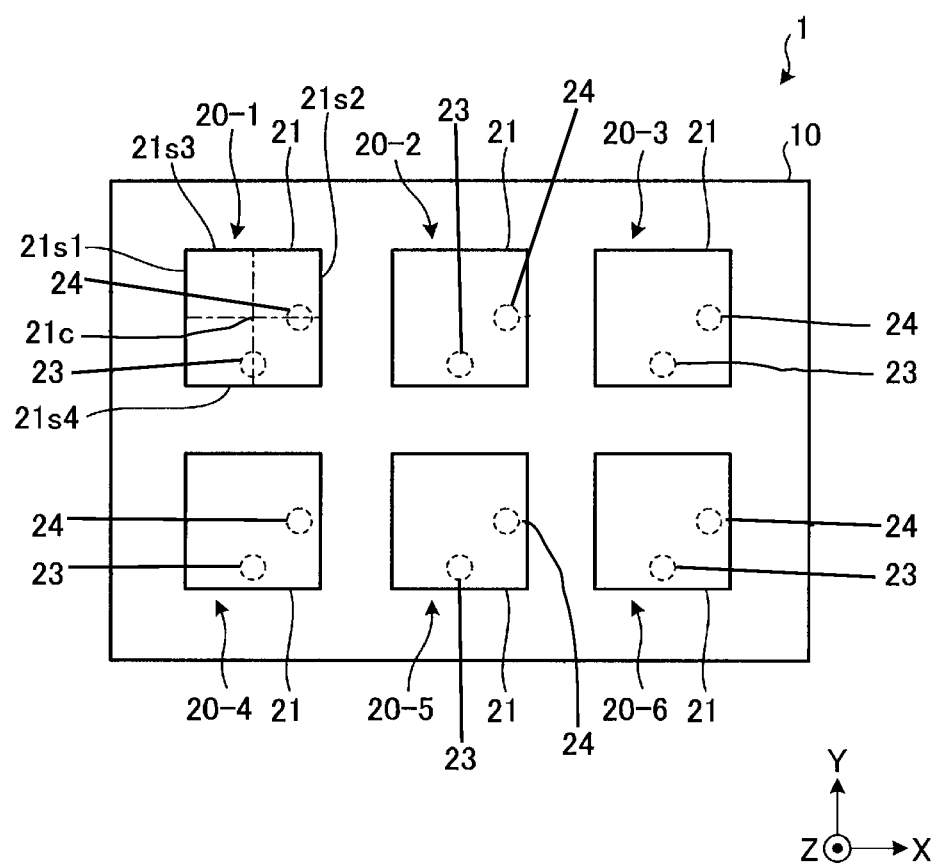
FIG. 3 is a sectional view taken along line III-III' of FIG. 2.

FIG. 1 is a plan view of an antenna module according to a first embodiment. FIG. 2 is a sectional view taken along line II-II' of FIG. 1. FIG. 3 is a sectional view taken along line III-III' of FIG. 2. As illustrated in FIG. 1, an antenna module 1 of the present embodiment includes a base member 10, a first antenna 20-1, a second antenna 20-2, a third antenna 20-3, a fourth antenna 20-4, a fifth antenna 20-5, and a sixth antenna 20-6. Note that, in the following description, when it is not necessary to distinguish the first antenna 20-1, the second antenna 20-2, the third antenna 20-3, the fourth antenna 20-4, the fifth antenna 20-5, and the sixth antenna 20-6, they will be referred to as the antennas 20. Each of the antennas 20 includes a radiating element 21 (not illustrated) and a parasitic element 22.

In the following description, one direction in a plane parallel to a first surface 10a of the base member 10 will be referred to as an X direction. A direction that is perpendicular to the X direction in the plane parallel to the first surface 10a will be referred to as a Y direction. A direction that is perpendicular to the X direction and the Y direction will be referred to as a Z direction. Note that the relationship between these directions is not limited to the above, and the Y direction may intersect the X direction at an angle other than 90 degrees. The Z direction may intersect the X direction and the Y direction, each at an angle other than 90 degrees.

As illustrated in FIG. 1, the plurality of antennas 20 are arranged in a matrix. In other words, some of the antennas 20 are arranged in the X direction, and some of the antennas 20 are arranged in the Y direction. The antenna module 1 is an array antenna that includes the plurality of antennas 20.

As illustrated in FIG. 2, the antenna module 1 further includes a control circuit 30, first feed lines 33, and second feed lines 34. The base member 10 has the first surface 10a and a second surface 10b that is opposite to the first surface 10a. For example, the base member 10 is formed of a low-temperature co-fired ceramic multilayer substrate (an LTCC multilayer substrate). The base member 10 includes a plurality of insulating layers laminated together in the Z direction. Each of the insulating layers is made of a ceramic material that can be fired at a low temperature of 1,000° C. or lower and is formed into a thin layer. Note that the base member 10 is not limited to this and may be a multilayer resin substrate that is formed by laminating a plurality of resin layers each of which is made of a resin, such as an epoxy resin or a polyimide resin. In addition, the base 10 may be formed by using a liquid crystal polymer (LCP) or a fluorine-based resin that has a lower dielectric constant. Alternatively, the base member 10 may be a ceramic multilayer substrate. The base member 10 may be a flexible wiring board having flexibility or may be a rigid printed board having thermoplasticity.

The antennas 20 are, for example, patch antennas that are used for high-frequency signals within a bandwidth of 60 GHz, which is used by wireless gigabit (WiGig). Each of the antennas 20 includes the radiating element 21 and the parasitic element 22. Each of the radiating elements 21 is disposed in or on an inner layer of the base member 10. The parasitic elements 22 are disposed on the first surface 10a of the base member 10 so as to face the corresponding radiating elements 21. Each of the parasitic elements 22 is disposed so as to be superposed with the corresponding radiating element 21 with at least one of the insulating layers of the base member 10 interposed therebetween. In other words, the parasitic elements 22 are insulated from the radiating elements 21. The radiating elements 21 and the parasitic elements 22 are each made of a metallic material having electrical conductivity, examples of the metallic material including copper, silver, gold, and alloy materials containing these metals.

As illustrated in FIG. 1, some of the parasitic elements 22 are arranged in the X direction, and some of the parasitic elements 22 are arranged in the Y direction. Similarly, as illustrated in FIG. 3, some of the radiating elements 21 are arranged in the X direction, and some of the radiating elements 21 are arranged in the Y direction. As illustrated in FIG. 1 and FIG. 3, when viewed in plan view, the radiating elements 21 and the parasitic elements 22 have the same shape, which is a quadrangular shape. Note that the radiating elements 21 and the parasitic elements 22 are not limited to having a quadrangular shape and may each have another shape such as a circular shape or a polygonal shape. In addition, the shapes of the radiating elements 21 and the shapes the parasitic elements 22 may be different from each other.

As illustrated in FIG. 2, a first end of each of the first feed lines 33 and a first end of each of the second feed lines 34 are connected to one of the radiating elements 21. Second ends of the first feed lines 33 and second ends of the second feed lines 34 are connected to the control circuit 30 via connection terminals 31.

The first feed lines 33 and the second feed lines 34 include vias 27, pads 28, and wiring lines 29. The vias 27 are formed as columnar conductors that extend through at least one insulating layer of the base member 10 in the Z direction. More specifically, the vias 27 are formed by providing a metallic material having electrical conductivity in through holes that extend through the insulating layers. Each of the pads 28 is disposed between the insulating layers so as to connect the vias 27 that are adjacent to each other in the Z direction to each other or so as to connect one of the vias 27 and one of the wiring lines 29 to each other. Each of the wiring lines 29 is disposed in or on an inner layer of the base member 10 so as to connect some of the vias 27 that are located at different positions when viewed in plan view. Similar to the radiating elements 21, the vias 27, the pads 28, and the wiring lines 29 are made of a metallic material having electrical conductivity.

The first feed lines 33 are connected to the corresponding radiating elements 21 at first ports 23. The second feed lines 34 are connected to the corresponding radiating elements 21 at second ports 24. As illustrated in FIG. 3, each of the first ports 23 is provided at a position that is displaced from the center 21c of one of the antennas 20 in the Y direction. Here, each of the radiating elements 21 has two sides 21s1 and 21s2 that oppose each other in the X direction and two sides 21s3 and 21s4 that are located between the side 21s1 and the side 21s2. The center 21c coincides with an intersection point of an imaginary line connecting the midpoint of the side 21s1 and the midpoint of the side 21s2 and an imaginary line connecting the midpoint of the side 21s3 and the midpoint of the side 21s4. Each of the first ports 23 is located in the vicinity of the side 21s4 of one of the radiating elements 21, the side 21s4 extending in the X direction. Each of the second ports 24 is located at a position that is displaced from the center 21c of one of the antennas 20 in the X direction. The second ports 24 is located in the vicinity of the side 21s2 of one of the radiating elements 21, the side 21s2 extending in the Y direction.

As illustrated in FIG. 2, the control circuit 30 is mounted on the second surface 10b of the base member 10 via the connection terminals 31. The connection terminals 31 are, for example, solder ball bumps. The control circuit 30 is sealed with a sealing resin 11. The control circuit 30 is a circuit that controls transmission and reception of signals via the antennas 20 and that controls electrical conductivity checks between the first feed lines 33, the radiating elements 21 of the antennas 20, and the second feed lines 34. The control circuit 30 is, for example, a radio frequency integrated circuit (RFIC).

With such a configuration, in the antenna module 1, the control circuit 30 and each of the antennas 20 are electrically connected to each other. More specifically, in the antenna module 1, the first feed lines 33, the radiating elements 21 of the antennas 20, and the second feed lines 34 are connected to the control circuit 30 via the connection terminals 31. As a result, in the antenna module 1, electrical conduction paths that connect the first feed lines 33, the radiating elements 21 of the antennas 20, and the second feed lines 34 to one another each form a closed loop circuit.

When a signal processing circuit 50 (see FIG. 4) of the control circuit 30 supplies a high-frequency signal to the first ports 23, a current flows through the radiating element 21 in the Y direction. This current flowing in the Y direction causes polarized waves that are parallel to the Y direction to be radiated. When the signal processing circuit 50 (see FIG. 4) of the control circuit 30 supplies a high-frequency signal to the second ports 24, a current flows through the radiating element 21 in the X direction. This current flowing in the X direction causes polarized waves that are parallel to the X direction to be radiated. As a result, the polarized waves of the antennas 20 can be switched by supplying the high-frequency signal to the first ports 23 or the second ports 24.

When the radiating elements 21 are excited, the radiating elements 21 and the corresponding parasitic elements 22 are magnetically coupled to each other. In this case, the antennas 20 has two resonant modes having different resonant frequencies. Thus, compared with the case where the parasitic elements 22 are not provided, a wider bandwidth of each of the antennas 20 can be achieved. In addition, the plurality of antennas 20 form an array antenna, and by controlling the arrangement of the radiating elements 21 of the antennas 20 or the amplitude and the phase of the exciting high-frequency signal, a desired radiation pattern (directivity) can be obtained.

Figure 4:
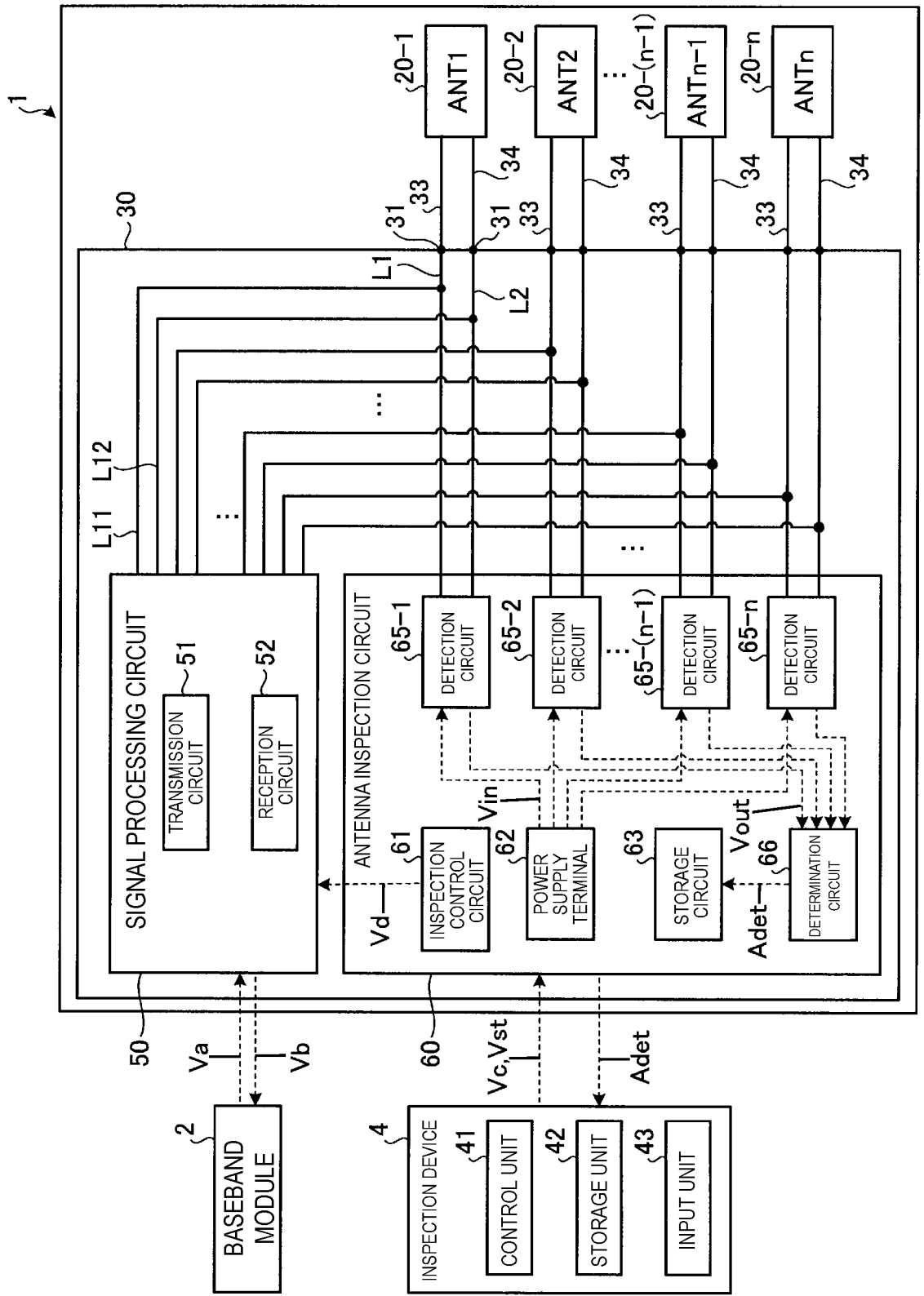
FIG. 4 is a block diagram illustrating a configuration example of the antenna module according to the first embodiment.
Figure 5:
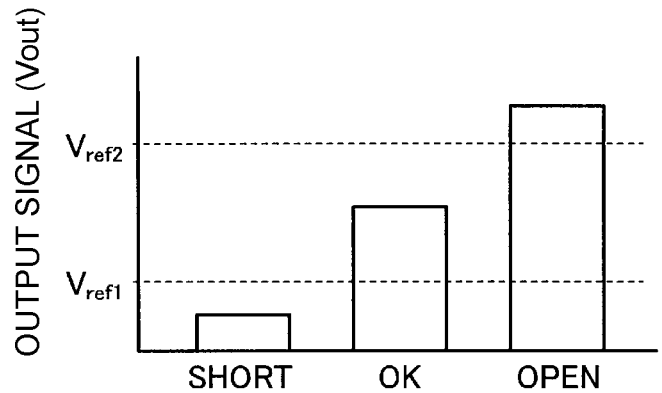
FIG. 5 is a graph schematically illustrating a relationship between an output signal and an electrical conductive condition of an antenna.

The configuration of the control circuit 30 will now be described. FIG. 4 is a block diagram illustrating a configuration example of the antenna module according to the first embodiment. FIG. 5 is a graph schematically illustrating a relationship between an output signal and an electrically conductive condition of an antenna. Note that, in FIG. 4, a case will be described in which the antenna module 1 includes n number of antennas 20. In other words, as illustrated in FIG. 4, the antenna module 1 includes a first antenna (ANT1) 20-1, a second antenna (ANT2) 20-2, . . . , an n−1th antenna (ANTn−1) 20-(n−1), and an nth antenna (ANTn) 20-n.

As illustrated in FIG. 4, the control circuit 30 includes the signal processing circuit 50 and an antenna inspection circuit 60. The signal processing circuit 50 is connected to the antennas 20 via the first feed lines 33 and the second feed lines 34. The signal processing circuit 50 contributes to transmission and reception of signals via the antennas 20. The antenna inspection circuit 60 is a circuit used for checking the electrical conductivity of each of the electrical conduction paths including the first feed lines 33, the radiating elements 21 of the antennas 20 (see FIG. 2), and the second feed lines 34. The control circuit 30 can perform switching between a communication mode and an inspection mode. In the communication mode, the control circuit 30 performs transmission and reception of signals via the antennas 20 by the operation of the signal processing circuit 50 in accordance with control signals from the outside. In the inspection mode, the control circuit 30 checks the electrical conductivity of each of the antennas 20 by the operation of the antenna inspection circuit 60.

The antenna inspection circuit 60 is electrically connected to the first feed lines 33 and the second feed lines 34 via first connection wiring lines L1 and L2. Second connection wiring lines L11 and L12 are connected to the first connection wiring lines L1 and L2 such that each of the second connection wiring lines L11 branches off from one of the first connection wiring lines L1 and that each of the second connection wiring lines L12 branches off from one of the first connection wiring lines L2. The signal processing circuit 50 is electrically connected to the first feed lines 33 and the second feed lines 34 via the second connection wiring lines L11 and L12. In other words, each of the antennas 20 is electrically connected to the signal processing circuit 50 and the antenna inspection circuit 60.

The signal processing circuit 50 includes a transmission circuit 51 and a reception circuit 52. At the time of transmission, a baseband module 2 supplies a baseband signal Va to the transmission circuit 51. The transmission circuit 51 modulates the baseband signal Va into a high-frequency signal (e.g., 60 GHz). Then, the transmission circuit 51 supplies the high-frequency signal to each of the antennas 20 via the first feed lines 33 and the second feed lines 34. At the time of reception, a high-frequency signal from each of the antennas 20 is supplied to the reception circuit 52. The reception circuit 52 demodulates the received high-frequency signal into a baseband signal Vb and supplies the baseband signal Vb to the baseband module 2. Note that the reception circuit 52 may output an intermediate-frequency signal having a frequency higher than that of the baseband signal Vb.

An external inspection device 4 that is connected to the control circuit 30 is, for example, a tester, a data logger, a personal computer, or the like. The inspection device 4 includes a control unit 41, a storage unit 42, and an input unit 43. The control unit 41 is, for example, an arithmetic processing unit including a central processing unit (CPU). The storage unit 42 stores a software program used for controlling an electrical conductivity check and various information items such as results of electrical conductivity checks performed on each of the antennas 20. The storage unit 42 is, for example, a circuit that functions as a nonvolatile storage device, such as a flash memory. The input unit 43 is, for example, an input device such as a keyboard or a touch panel. An operator inputs information related to an electrical conductivity check by using the input unit 43. In the present embodiment, the antenna module 1 includes the antenna inspection circuit 60. Thus, the configuration of the external inspection device 4 can be simplified. In addition, even if there is a different number of antennas 20, electrical conductivity checks can be performed by the general-purpose inspection device 4.

The antenna inspection circuit 60 includes an inspection control circuit 61, a power supply terminal 62, a storage circuit 63, a plurality of detection circuits 65-1, 65-2, . . . , 65-(n−1), and 65-n, and a determination circuit 66. Note that, in the following description, when it is not necessary to distinguish the detection circuits 65-1, 65-2, . . . , 65-(n−1), and 65-n, they will be referred to as the detection circuits 65.

The inspection control circuit 61 is a control circuit that controls the operations of the power supply terminal 62, the storage circuit 63, the plurality of detection circuits 65, and the determination circuit 66. The inspection control circuit 61 controls each electrical conductivity check on the basis of a control signal Vc and an inspection start signal Vst from the inspection device 4. In addition, the inspection control circuit 61 outputs a control signal Vd to the signal processing circuit 50 on the basis of the control signal Vc. The signal processing circuit 50 stops its operation on the basis of the control signal Vd and stops power supply to the antennas 20 and input/output of signals when an electrical conductivity check is performed.

The power supply terminal 62 supplies an input signal Vin for electrical conductivity check to the antennas 20 via the detection circuits 65.

The detection circuits 65-1, 65-2, . . . , 65-(n−1), and 65-n are electrically connected to the first antenna 20-1, the second antenna 20-2, . . . , the n−1th antenna 20-(n−1), and the nth antenna 20-n, respectively, via the first connection wiring lines L1 and L2. The detection circuits 65 are circuits that detect output signals Vout from the first feed lines 33, the antennas 20, and the second feed lines 34. Each of the detection circuits 65 detects, as the output signal Vout, the inter-terminal voltage between one of the connection terminals 31 to which one of the first feed lines 33 is connected and one of the connection terminals 31 to which one of the second feed lines 34 is connected. Each of the detection circuits 65 outputs the output signal Vout to the determination circuit 66. Note that the detection circuits 65 are not limited to have the above configuration and may be configured to detect the current that flows through the first feed lines 33, the antennas 20, and the second feed lines 34.

The determination circuit 66 is a circuit that determines, on the basis of the output signals Vout, the electrical continuity between the first feed lines 33, the radiating elements 21 of the antennas 20, and the second feed lines 34. The determination circuit 66 is, for example, a circuit that includes a comparator. The determination circuit 66 supplies an inspection signal Adet as a digital signal to the storage circuit 63 for each of the antennas 20, the inspection signal Adet corresponding to the electrically conductive condition of the antenna 20. The determination circuit 66 outputs "1" as the inspection signal Adet when the electrical conductivity of one of the antennas 20 is favorable and outputs "0" as the inspection signal Adet when the electrical conductivity of one of the antennas 20 is poor.

FIG. 5 illustrates an example of a determination method used by the determination circuit 66. The determination circuit 66 compares the output signal Vout and a reference signals Vref1 and Vref2. The reference signals Vref1 and Vref2 are each a voltage signal based on a reference value stored in the storage unit 42 of the inspection device 4.

When the output signal Vout is equal to or greater than the reference signal Vref1 and equal to or less than the reference signal Vref2, the determination circuit 66 determines that the electrical conductivity of the closed loop that is formed of one of the first feed lines 33, the radiating element 21 of a corresponding one of the antennas 20, and a corresponding one of the second feed lines 34 is favorable (OK). In this case, the determination circuit 66 outputs "1" as the inspection signal Adet. In contrast, when the output signal Vout is less than the reference signal Vref1, the determination circuit 66 determines that a portion of the closed loop formed of the first feed line 33, the radiating element 21 of the antenna 20, and the second feed lines 34 is short-circuited (SHORT). When the output signal Vout is greater than the reference signal Vref2, the determination circuit 66 determines that a portion of the closed loop formed of the first feed line 33, the radiating element 21 of the antenna 20, and the second feed lines 34 is broken (OPEN). When the determination circuit 66 determines a short-circuit (SHORT) or a breakage (OPEN), the determination circuit 66 outputs "0" as the inspection signal Adet.

The storage circuit 63 is a circuit that stores the inspection signals Adet for each of the antennas 20. When an electrical conductivity check is completed, the inspection control circuit 61 outputs the inspection signals Adet to the inspection device 4. As a result, the electrical conductivity of each of the antennas 20 can be checked. Note that the configuration of the antenna inspection circuit 60 illustrated in FIG. 4 is merely an example and may be suitably changed. For example, some functions of the antenna inspection circuit 60 such as the storage circuit 63 may be included in the external inspection device 4.

As described above, the antenna module 1 according to the present embodiment can check the electrical conductivity of each of the radiating elements 21 disposed in or on an inner layer of the base member 10 by using the first feed lines 33 and the second feed lines 34, which are used in transmission and reception of signals via the antennas 20. If terminals, wiring lines, or the like that are used for electrical conductivity checks are provided separately from the first feed lines 33 and the second feed lines 34, there is a possibility that the performances of the antennas 20 may change in transmission and reception of millimeter waves in a frequency band of 60 GHz. In the present embodiment, it is not necessary to provide terminals, wiring lines, or the like that are used for electrical conductivity checks, and thus, changes in the performances of the antennas 20 can be suppressed.

Figure 6:
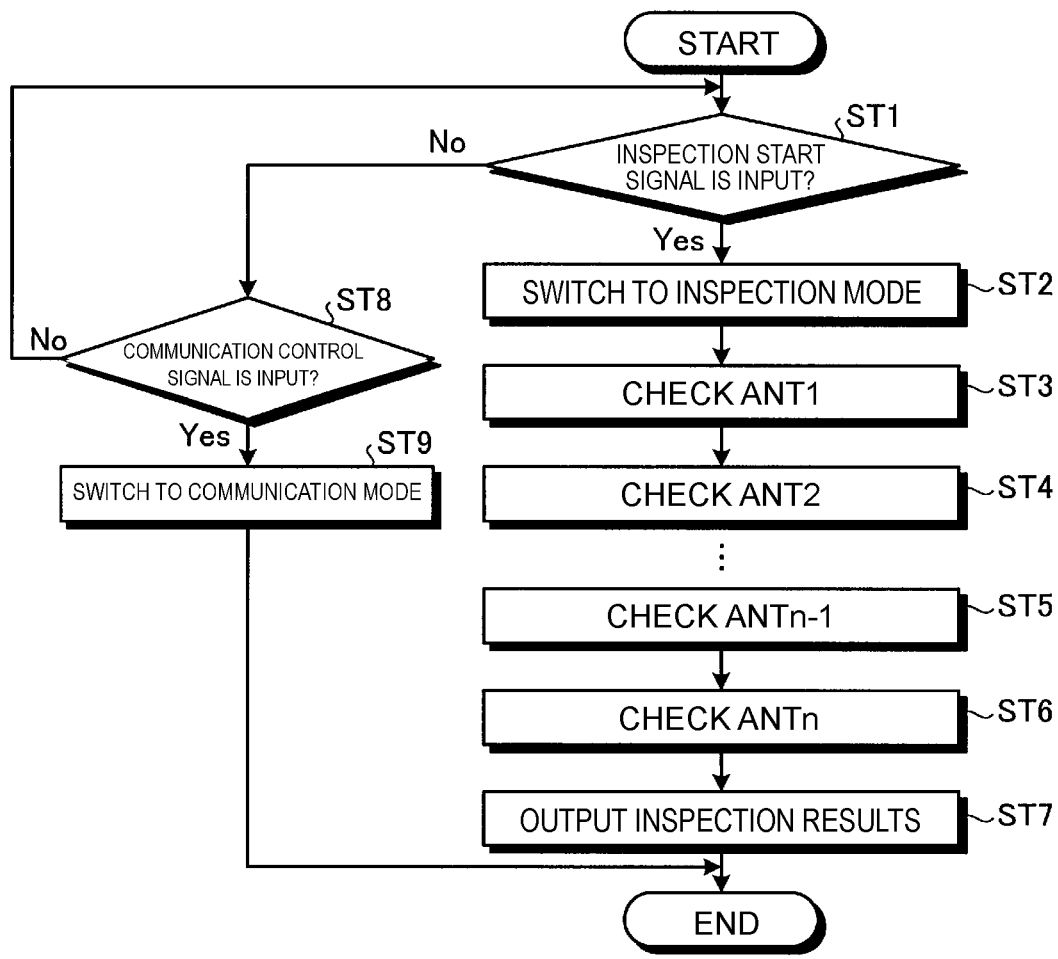
FIG. 6 is a flowchart illustrating a method for checking the electrical conductivity of the antenna module according to the first embodiment.

A method for checking the electrical conductivity of the antenna module 1 will now be described with reference to FIG. 4 to FIG. 6. FIG. 6 is a flowchart illustrating a method for checking the electrical conductivity of the antenna module according to the first embodiment. As illustrated in FIG. 6, the control circuit 30 determines whether the inspection start signal Vst is input (step ST1). When the inspection start signal Vst is not input (No in step ST1), the control circuit 30 determines whether a communication control signal is input (step ST8). The communication control signal is a signal for controlling functions of transmitting and receiving signals via an antenna and is supplied from, for example, a control board (not illustrated). When the communication control signal is input (Yes in step ST8), the control circuit 30 switches to the communication mode (step ST9). As a result, the signal processing circuit 50 performs transmission and reception of signals via the antennas 20. When the communication control signal is not input (No in step ST8), the control circuit 30 does not switch to either the communication mode or the inspection mode, and the process returns to step ST1.

When the inspection start signal Vst is input (Yes in step ST1), the control circuit 30 switches to the inspection mode (step ST2). The inspection control circuit 61 uses the inspection start signal Vst as a trigger and causes the power supply terminal 62, the storage circuit 63, the plurality of detection circuits 65, and the determination circuit 66 to operate. First, the inspection control circuit 61 performs an electrical conductivity check on the first antenna 20-1 (step ST3). By the operations of the power supply terminal 62, the detection circuit 65-1, and the determination circuit 66, the inspection signal Adet corresponding to the electrically conductive condition of the first antenna 20-1 is stored in the storage circuit 63. When the electrical conductivity check performed on the first antenna 20-1 is complete, the inspection control circuit 61 performs an electrical conductivity check on the second antenna 20-2 (step ST4). Similarly, the inspection control circuit 61 sequentially performs electrical conductivity checks on the other antennas 20, performs an electrical conductivity check on the (n−1)th antenna 20-(*n*−1) (step ST5), and performs an electrical conductivity check on the nth antenna 20-*n* (step ST6).

As described above, the inspection control circuit 61 sequentially checks the electrical conductivity of each of the plurality of antennas 20. Then, the inspection signals Adet corresponding to all the antennas 20 that have been checked are stored in the storage circuit 63. When the electrical conductivity checks on all the antennas 20 are complete, the inspection control circuit 61 outputs the inspection results to the inspection device 4 (step ST7). In the present embodiment, the inspection results that are supplied to the inspection device 4 are the inspection signals Adet corresponding to all the antennas 20. As a result, among the plurality of antennas 20, the antenna 20 in which an electrical conduction abnormality has occurred can be determined.

Figure 7:
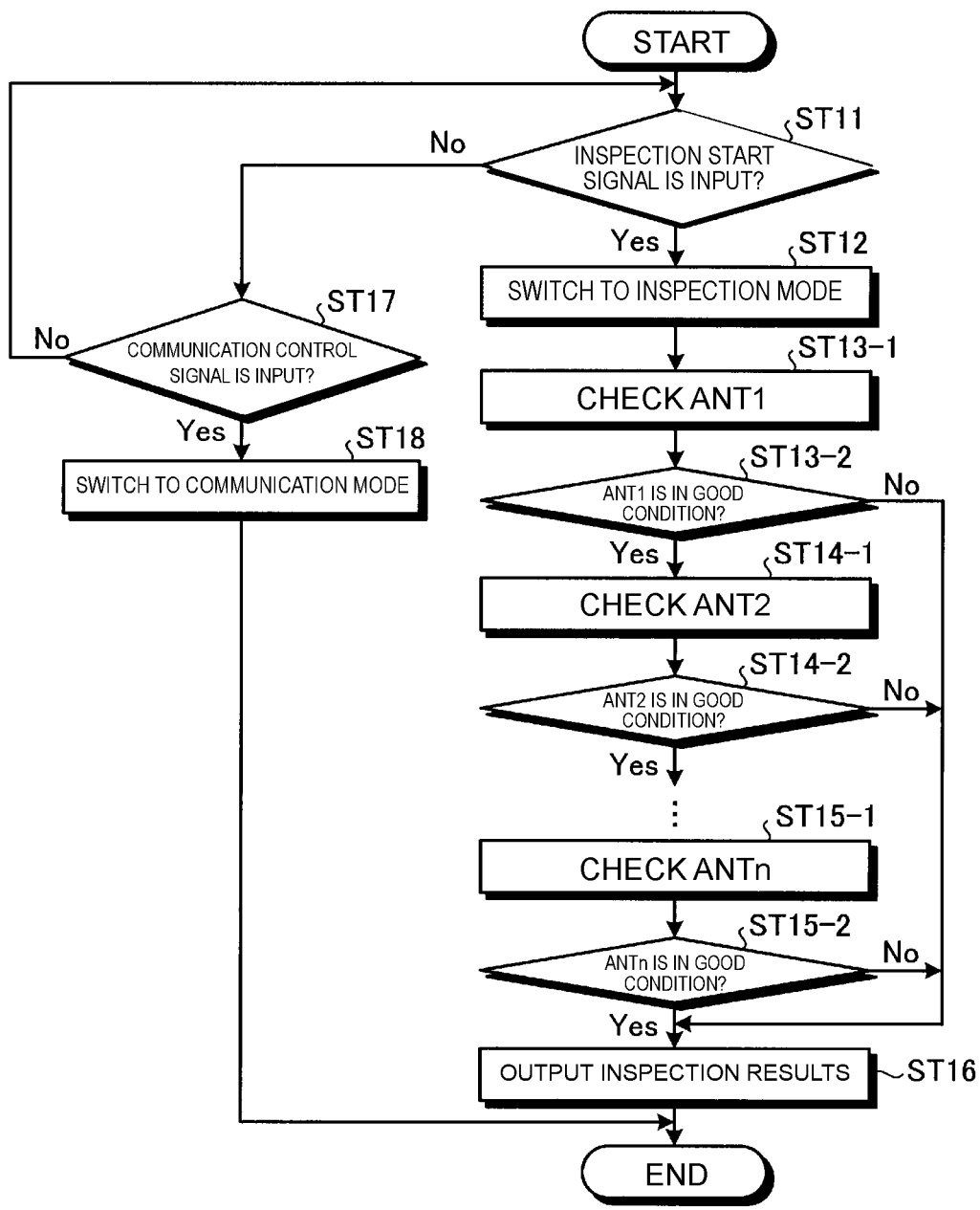
FIG. 7 is a flowchart illustrating another example of the method for checking the electrical conductivity of the antenna module according to the first embodiment.

The electrical conductivity checking method that is illustrated in FIG. 6 is merely an example and may be suitably changed. FIG. 7 is a flowchart illustrating another example of the method for checking the electrical conductivity of the antenna module according to the first embodiment. As illustrated in FIG. 7, the steps of performing switching between the communication mode and the inspection mode (steps ST11, ST12, ST17, and ST18) are similar to those in the method that is illustrated in FIG. 6 as an example.

First, the inspection control circuit 61 uses the inspection start signal Vst as a trigger and performs an electrical conductivity check on the first antenna 20-1 (step ST13-1). The determination circuit 66 determines whether the electrical conductivity of the first antenna 20-1 is favorable (step ST13-2). When the electrical conductivity of the first antenna 20-1 is poor (short-circuit or breakage) (No in step ST13-2), the inspection control circuit 61 terminates the electrical conductivity check on the basis of the inspection signal Adet from the determination circuit 66 and outputs the inspection result to the inspection device 4 (step ST16). The inspection result in this case indicates that an electrical conduction failure has occurred in the antenna module 1.

When the electrical conductivity of the first antenna 20-1 is favorable (Yes in step ST13-2), the inspection control circuit 61 performs an electrical conductivity check on the second antenna 20-2 (step ST14-1). The determination circuit 66 determines whether the electrical conductivity of the second antenna 20-2 is favorable (step ST14-2). When the electrical conductivity of the second antenna 20-2 is poor (short-circuit or breakage) (No in step ST14-2), the inspection control circuit 61 terminates the electrical conductivity check and outputs the inspection result to the inspection device 4 (step ST16). When the electrical conductivity of the second antenna 20-2 is favorable (Yes in step ST14-2), electrical conductivity checks are sequentially performed on the other antennas 20 in a similar manner to the above.

The inspection control circuit 61 performs an electrical conductivity check on the nth antenna 20-*n* (step ST15-1). The determination circuit 66 determines whether the electrical conductivity of the nth antenna 20-*n* is favorable (step ST15-2). When the electrical conductivity of the nth antenna 20-*n* is poor (short-circuit or breakage) (No in step ST15-2), the inspection control circuit 61 terminates the electrical conductivity check and outputs the inspection result to the inspection device 4 (step ST16). When the electrical conductivity of the nth antenna 20-*n* is favorable (Yes in step ST15-2), the inspection control circuit 61 terminates the electrical conductivity check and outputs the inspection results indicating that all the antennas 20 have favorable electrical conductivity to the inspection device 4 (step ST16).

As described above, in the other example of the embodiment of the present application, when it is detected that an electrical conduction failure has occurred in any one of the plurality of antennas 20, it is determined that an electrical conduction failure has occurred in the antenna module 1, and the electrical conductivity check is terminated. Since the electrical conductivity check is terminated when any one of the antennas 20 is determined to be a faulty antenna, the electrical conductivity check can be performed in a shorter time compared with the method in which a determination is made after all the antennas 20 have been checked. In addition, it is not necessary to hold the inspection signals Adet of the individual antennas 20, the circuit size of the storage circuit 63 can be reduced.

(Modification)

Figure 8:
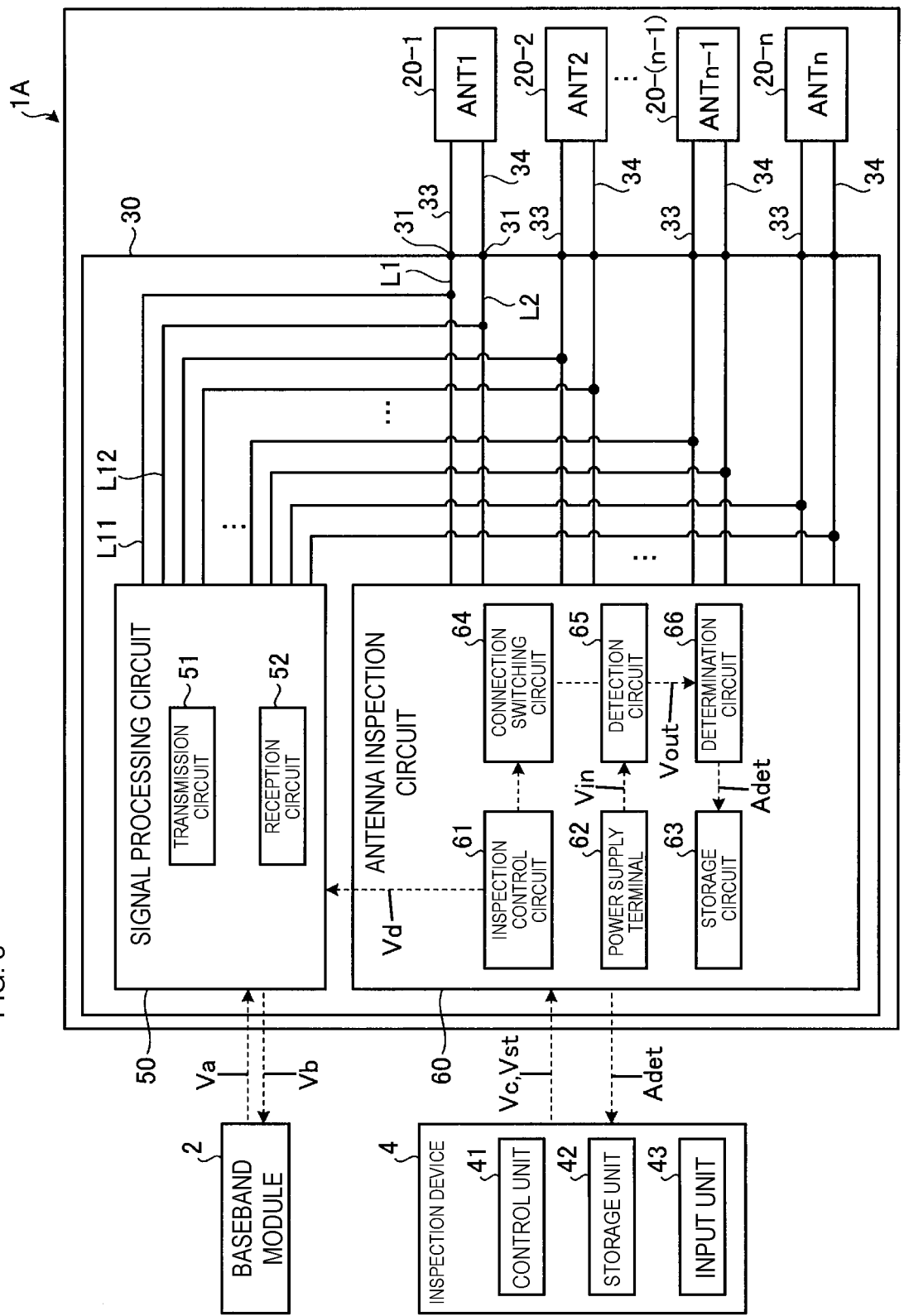
FIG. 8 is a block diagram illustrating a configuration example of an antenna module according to a modification of the first embodiment.

FIG. 8 is a block diagram illustrating a configuration example of an antenna module according to a modification of the first embodiment. In an antenna module 1A of the present embodiment, the antenna inspection circuit 60 further includes a connection switching circuit 64. In addition, only one detection circuit 65 is provided. The connection switching circuit 64 is a switch circuit that switches the connection between the detection circuit 65, and each of the antennas 20 in accordance with control signals from the inspection control circuit 61.

In the inspection mode, the inspection control circuit 61 connects the detection circuit 65 and the first antenna 20-1 to each other by the operation of the connection switching circuit 64 and performs an electrical conductivity check on the first antenna 20-1. Then, the inspection control circuit 61 connects the detection circuit 65 and the second antenna 20-2 to each other by the operation of the connection switching circuit 64 and performs an electrical conductivity check on the second antenna 20-2. In this manner, the connection switching circuit 64 sequentially connects the detection circuit 65 and each of the antennas 20 in a time division manner. As a result, the antenna module 1A can perform electrical conductivity checks on all the antennas 20 in a similar manner to the electrical conductivity checking method that is illustrated in FIG. 6.

In the present modification, since the connection switching circuit 64 is provided, it is not necessary to provide the detection circuit 65 for each of the antennas 20. Thus, in the case where the number of the antennas 20 is large, the circuit size of the antenna inspection circuit 60 can be reduced.

As described above, each of the antenna modules 1 and 1A of the present embodiment includes the base member 10, the antennas 20 including the radiating elements 21 provided on the inner layer of the base member 10, the first feed lines 33, the second feed lines 34, and the control circuit 30, the first feed lines 33 and the second feed lines 34 being connected to the radiating elements 21, and the control circuit 30 being connected to the radiating elements 21 via the first feed lines 33 and the second feed lines 34. The control circuit 30 includes the signal processing circuit 50, which is connected to the antennas 20 via the first feed lines 33 or the second feed lines 34, and the antenna inspection circuit 60 that checks the electrical conductivity of each of the electrical conduction paths including the first feed lines 33 the radiating elements 21, and the second feed lines 34.

According to the above-described configuration, the electrical conductivity of each of the radiating elements 21 disposed on the inner layer of the base member 10 can be checked by using the first feed lines 33 and the second feed lines 34, which are used in transmission and reception of signals via the antennas 20. In addition, since it is not necessary to provide terminals, wiring lines, or the like that are used for electrical conductivity checks, changes in the signal transmission/reception performances via the antennas 20 can be suppressed. Furthermore, since the control circuit 30 includes the antenna inspection circuit 60 that checks the electrical conductivity of each of the antennas 20, electrical conductivity checks can be easily performed without necessarily bringing a probe into contact with each of the antennas 20.

In each of the antenna modules 1 and 1A of the present embodiment, the control circuit 30 performs switching between the communication mode in which transmission and reception of signals via the antennas 20 is performed by the operation of the signal processing circuit 50 and the inspection mode in which the electrical conductivity of each of the electrical conduction paths is checked by the operation of the antenna inspection circuit 60. According to this configuration, the first feed lines 33 and the second feed lines 34 can be commonly used in the communication mode and the inspection mode. In addition, the operations in the inspection mode are performed during a period different from the period when the operations in the communication mode are performed, and thus, changes in the signal transmission/reception performances via the antennas 20 can be suppressed.

In each of the antenna modules 1 and 1A of the present embodiment, the antenna inspection circuit 60 includes the detection circuits 65 that detects the output signals Vout from the first feed lines 33, the radiating elements 21, and the second feed lines 34 and the determination circuit 66 that determines the electrical conductivity of each of the electrical conduction paths on the basis of the output signals Vout. According to this configuration, it can be checked whether the electrical conductivity is favorable or abnormal from determination results obtained by the determination circuit 66. In addition, since the antenna inspection circuit 60 includes the detection circuits 65 and the determination circuit 66, the configuration of the inspection device 4 that is used for electrical conductivity checks and that is connected to the antenna modules 1 or 1A can be simplified.

In each of the antenna modules 1 and 1A of the present embodiment, the plurality of antennas 20 are arranged on and in the base member 10, the antenna inspection circuit 60 sequentially checks the electrical conductivity of the electrical conduction paths for the plurality of antennas 20 and outputs inspection results of all the antennas 20 that have been checked. According to this configuration, among the plurality of antennas 20, the antenna 20 in which an electrical conduction abnormality has occurred can be easily determined.

In each of the antenna modules 1 and 1A of the present embodiment, the plurality of antennas 20 are arranged on and in the base member 10, and the antenna inspection circuit 60 sequentially checks the electrical conductivity of the electrical conduction paths for the plurality of antennas 20 and terminates the electrical conductivity check when an electrical conduction abnormality is detected in any one of the antennas 20. According to this configuration, it is not necessary to check all the antennas 20, and the electrical conductivity check can be performed in a short time.

In each of the antenna modules 1 and 1A of the present embodiment, the base member 10 has the first surface 10a and the second surface 10b that is opposite to the first surface 10a. The antennas 20 further include the parasitic elements 22 that are disposed on the first surface 10a so as to face the corresponding radiating elements 21, and the control circuit 30 is mounted on the second surface 10b of the base member 10. According to this configuration, a wider bandwidth of each of the antennas 20 can be achieved.

In the method for inspecting each of the antenna modules 1 and 1A of the present embodiment, the control circuit 30 switches to the inspection mode in which the electrical conductivity of each of the electrical conduction paths is checked, and the antenna inspection circuit 60 sequentially checks the electrical continuity between the first feed lines 33, the radiating elements 21, and the second feed lines 34 for the plurality of antennas 20.

Note that the configurations of the antenna modules 1 and 1A can be suitably changed. For example, in FIG. 1 to FIG. 3, the configurations of the antennas 20, the first feed lines 33, the second feed lines 34, and the control circuit 30 are schematically illustrated for ease of understanding, and the configuration of the antenna module 1 is not limited to the configuration illustrated in FIG. 1 to FIG. 3. For example, the arrangement of the antennas 20 and the number of the antennas 20 can be suitably changed. The present disclosure is not limited to the case where the plurality of antennas 20 are provided, and one antenna 20 may be provided. An antenna different from the antennas 20 or a circuit element may be provided in or on the base member 10. A ground layer or the like may be included in the base member 10 as an inner layer of the base member 10. The antennas 20 may not include the parasitic elements 22 and may include only the radiating elements 21.

Second Embodiment

Figure 9:
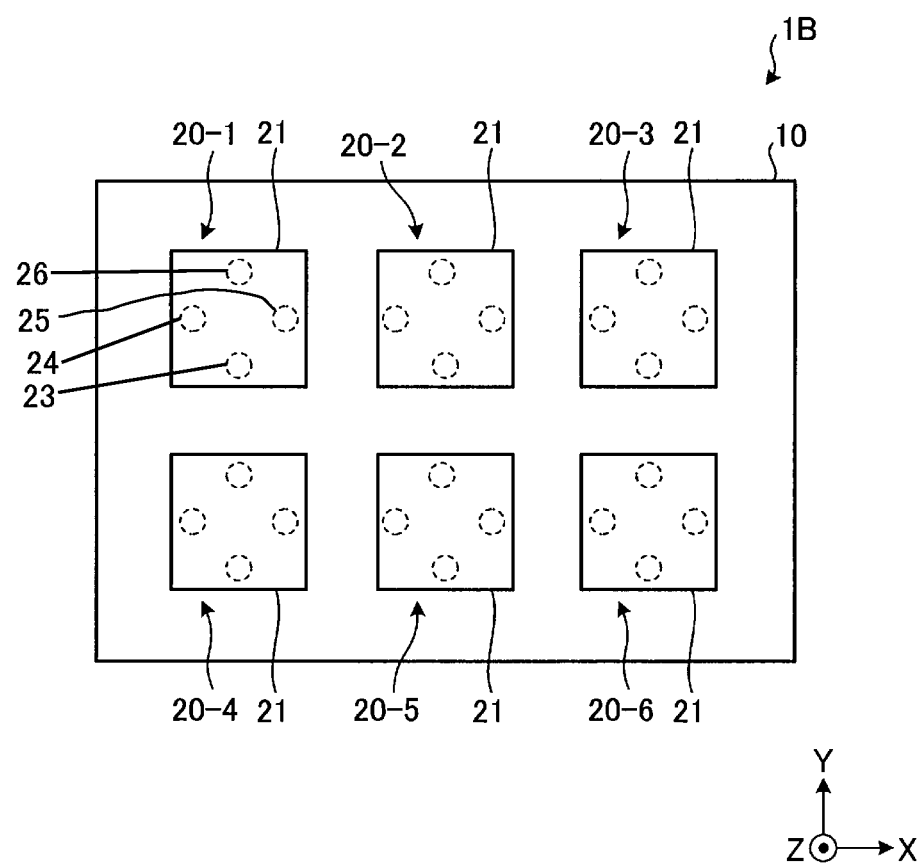
FIG. 9 is a plan view illustrating radiating elements of an antenna module according to a second embodiment.
Figure 10:
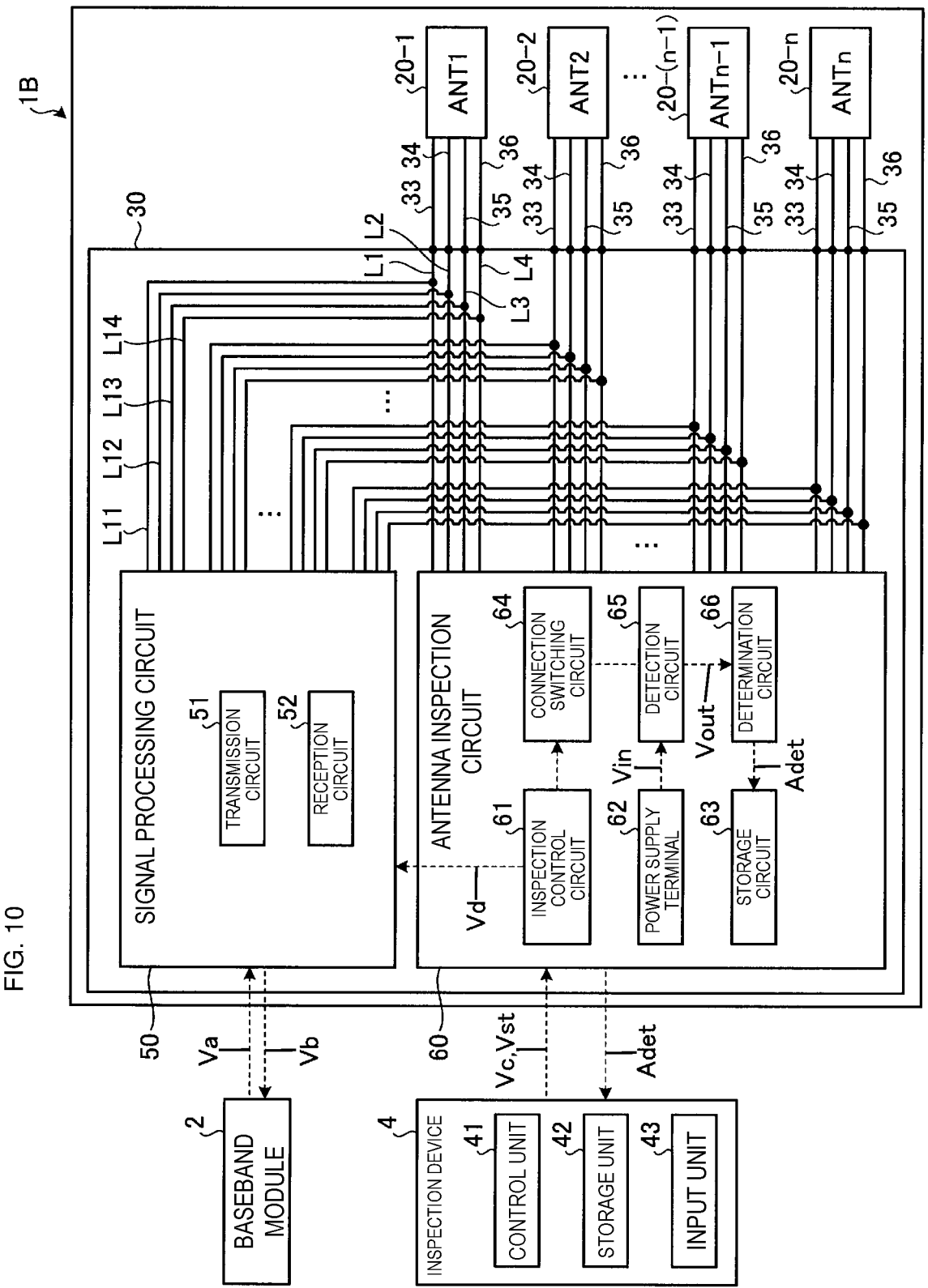
FIG. 10 is a block diagram illustrating a configuration example of the antenna module according to the second embodiment.

FIG. 9 is a plan view illustrating radiating elements of an antenna module according to a second embodiment. FIG. 10 is a block diagram illustrating a configuration example of the antenna module according to the second embodiment. As illustrated in FIG. 9, in an antenna module 1B of the present embodiment, the antennas 20 have third ports 25 and fourth ports 26 in addition to the first ports 23 and the second ports 24. Each of the third ports 25 is provided on the side opposite to the side on which one of the second ports 24 is provided with the center of one of the antennas 20 interposed therebetween. Each of the fourth ports 26 is provided on the side opposite to the side on which one of the first ports 23 is provided with the center of one of the antennas 20 interposed therebetween.

As illustrated in FIG. 10, each of the antennas 20 is connected to one of the first feed lines 33, one of the second feed lines 34, one of third feed lines 35, and one of fourth feed lines 36. The first feed lines 33 are connected to the first ports 23 illustrated in FIG. 9. Similarly, the second feed lines 34 are connected to the second ports 24. The third feed lines 35 are connected to the third ports 25. The fourth feed lines 36 are connected to the fourth ports 26.

The first feed lines 33, the second feed lines 34, the third feed lines 35, and the fourth feed lines 36 are electrically connected to the antenna inspection circuit 60 via the first connection wiring lines L1, the first connection wiring lines L2, first connection wiring lines L3, and first connection wiring lines L4, respectively. The first feed lines 33, the second feed lines 34, the third feed lines 35, and the fourth feed lines 36 are electrically connected to the signal processing circuit 50 the second connection wiring lines L11, the second connection wiring lines L12, second connection wiring lines L13, and second connection wiring lines L14, respectively.

In the communication mode, the signal processing circuit 50 can supply high-frequency signals to the antennas 20 via the first feed lines 33, the second feed lines 34, the third feed lines 35, and the fourth feed lines 36. Even if breakage of any one of the first feed lines 33, the second feed lines 34, the third feed lines 35, and the fourth feed lines 36 occurs, transmission and reception of signals via the antennas 20 can be performed.

Also in the present embodiment, electrical conductivity checks can be performed by using the first feed lines 33, the second feed lines 34, the third feed lines 35, and the fourth feed lines 36. Note that, although FIG. 10 illustrates the configuration in which the connection between the detection circuits 65 and each of the antennas 20 is switched by the connection switching circuit 64, the present disclosure is not limited to this configuration. Also in the present embodiment, a configuration can be employed in which a plurality of detection circuits 65 are provided so as to correspond in one-to-one to the antennas 20 as in the configuration illustrated in FIG. 4.

Figure 11:
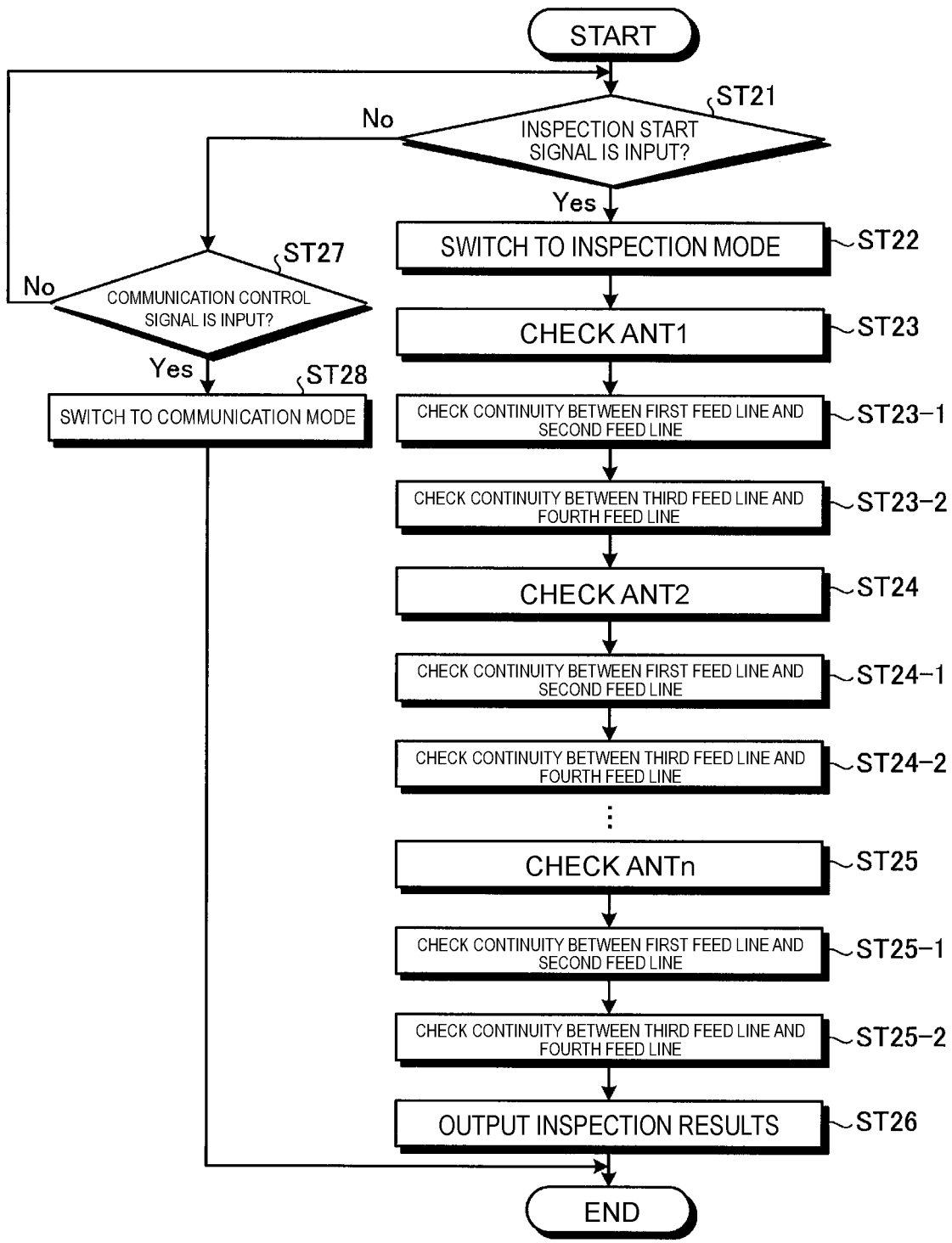
FIG. 11 is a flowchart illustrating a method for checking the electrical conductivity of the antenna module according to the second embodiment.

FIG. 11 is a flowchart illustrating a method for checking the electrical conductivity of the antenna module according to the second embodiment. As illustrated in FIG. 11, the steps of performing switching between the communication mode and the inspection mode (steps ST21, ST22, ST27, and ST28) are similar to those in the method that is illustrated in FIG. 6 as an example.

First, the inspection control circuit 61 uses the inspection start signal Vst as a trigger and performs an electrical conductivity check on the first antenna 20-1 (step ST23). The inspection control circuit 61 checks the electrical continuity between the first feed line 33 and the second feed line 34 of the first antenna 20-1 (step ST23-1). More specifically, the detection circuits 65 detects the output signals Vout that are output by the first feed line 33, the radiating element 21 of the first antenna 20-1, and the second feed line 34. The determination circuit 66 determines the electrical continuity between the first feed line 33, the radiating element 21 of the first antenna 20-1, and the second feed line 34 on the basis of the output signals Vout. As a result, the electrical continuity between the first feed line 33 and the second feed line 34 is checked.

Similarly, the inspection control circuit 61 checks the electrical continuity between the third feed line 35 and the fourth feed line 36 of the first antenna 20-1 (step ST23-2). When the electrical continuity between the first feed line 33 and the second feed line 34 is favorable, and the electrical continuity between the third feed line 35 and the fourth feed line 36 is favorable, the determination circuit 66 determines that the electrical conductivity of the first antenna 20-1 is favorable. When at least one of the electrical continuity between the first feed line 33 and the second feed line 34 and the electrical continuity between the third feed line 35 and the fourth feed line 36 is poor, it is determined that an electrical conduction failure has occurred in the first antenna 20-1.

Similarly, the inspection control circuit 61 sequentially performs electrical conductivity checks on the second antenna 20-2 to the nth antenna 20-n (step ST24, ST24-1, ST24-2, ST25, ST25-1, and ST25-2). When the electrical conductivity checks on all the antennas 20 are complete, the inspection control circuit 61 outputs the inspection results to the inspection device 4 (step ST26). In the present embodiment, the inspection results that are supplied to the inspection device 4 may be the inspection signals Adet corresponding to all the antennas 20 or may be the inspection signals Adet, each of which corresponds to a pair of the feed lines.

As a result, among the plurality of antennas 20, the antenna 20 in which an electrical conduction abnormality has occurred can be easily determined.

Note that the present disclosure is not limited to the example illustrated in FIG. 11, and when it is detected that an electrical conduction failure has occurred in any one of the plurality of antennas 20, it may be determined that an electrical conduction failure has occurred in the antenna module 1, and the electrical conductivity check may be terminated. In addition, in an electrical conductivity check that is performed on one of the antennas 20, the two feed lines to be selected may be suitably changed. For example, the electrical continuity between the first feed lines 33 and the third feed lines 35 may be checked, and the electrical continuity between the second feed line 34 and the fourth feed line 36 may be checked.

Third Embodiment

Figure 12:
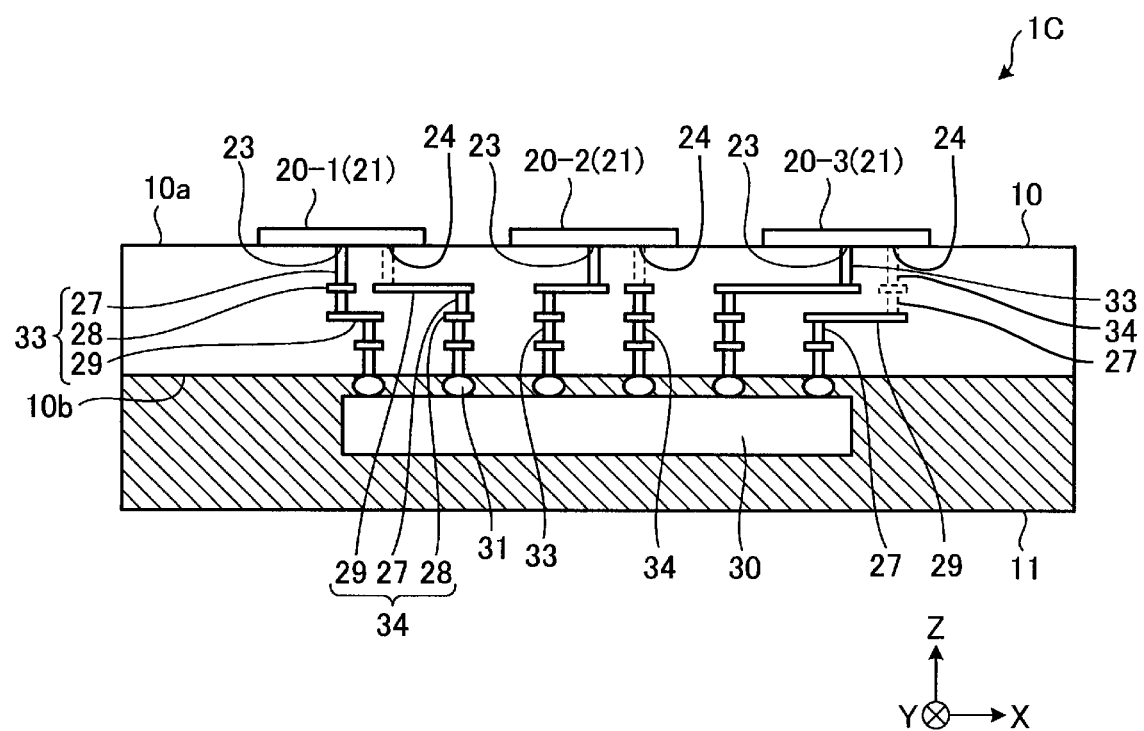
FIG. 12 is a sectional view illustrating an antenna module according to a third embodiment.

FIG. 12 is a sectional view illustrating an antenna module according to a third embodiment. Unlike the above-described embodiments, a configuration in which the parasitic elements 22 are not provided will be described in the third embodiment. As illustrated in FIG. 12, the antennas 20 include the radiating elements 21. The radiating elements 21 are disposed on the first surface 10a (the front surface) of the base member 10 and are exposed at the base member 10. In an antenna module 1C that has such a configuration, the configuration of each of the antennas 20 can be more simplified than that in each of the first and second embodiments.

Note that the configuration according to the third embodiment can also be applied to the antenna modules 1, 1A, and 1B of the first and second embodiments.

Figure 13:
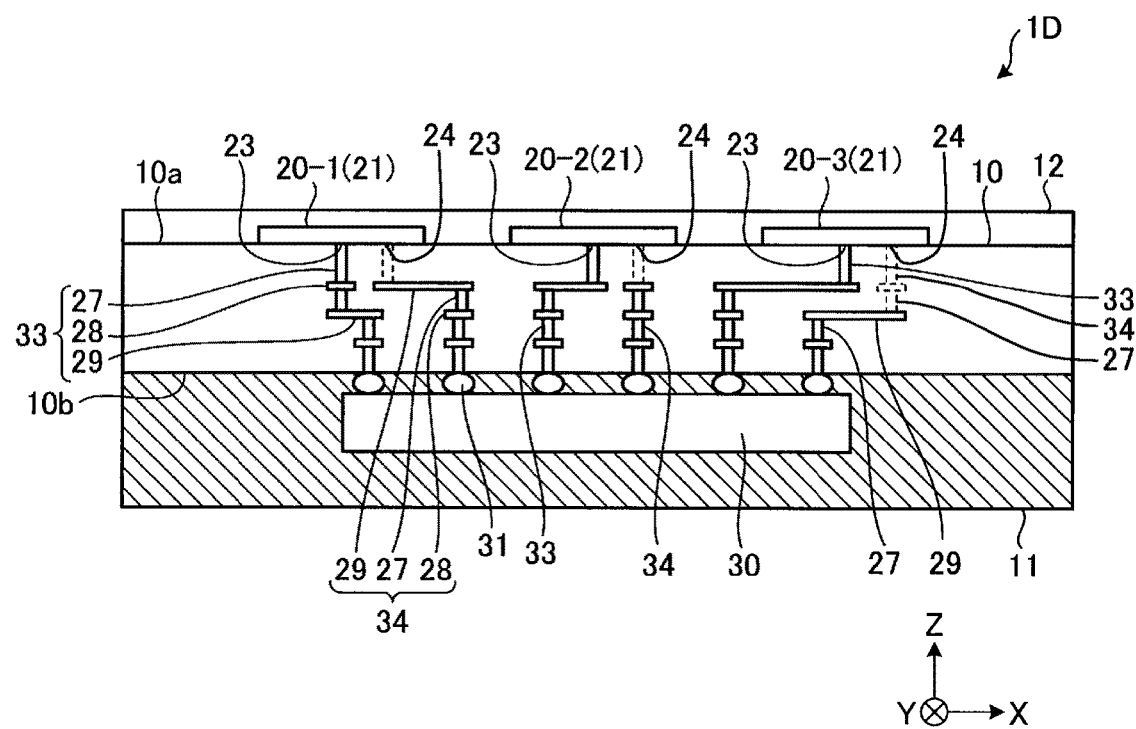
FIG. 13 is a sectional view illustrating an antenna module according to a first modification of the third embodiment.

FIG. 13 is a sectional view illustrating an antenna module according to a first modification of the third embodiment. Unlike the above-described third embodiment, a configuration in which a protective layer 12 is provided will be described in the first modification of the third embodiment. As illustrated in FIG. 13, the protective layer 12 is provided on the first surface 10a (the front surface) of the base member 10 so as to cover the radiating elements 21. The protective layer 12 is made of, for example, a resin material that is used as a solder resist. In an antenna module 1D that has such a configuration, the antennas 20 are protected by the protective layer 12, so that the possibility that the antennas 20 will become damaged can be further reduced than in the third embodiment.

Note that the configuration according to the first modification of the third embodiment in which the protective layer 12 is provided can also be applied to the antenna modules 1, 1A, and 1B of the first, second, and third embodiments.

Figure 14:
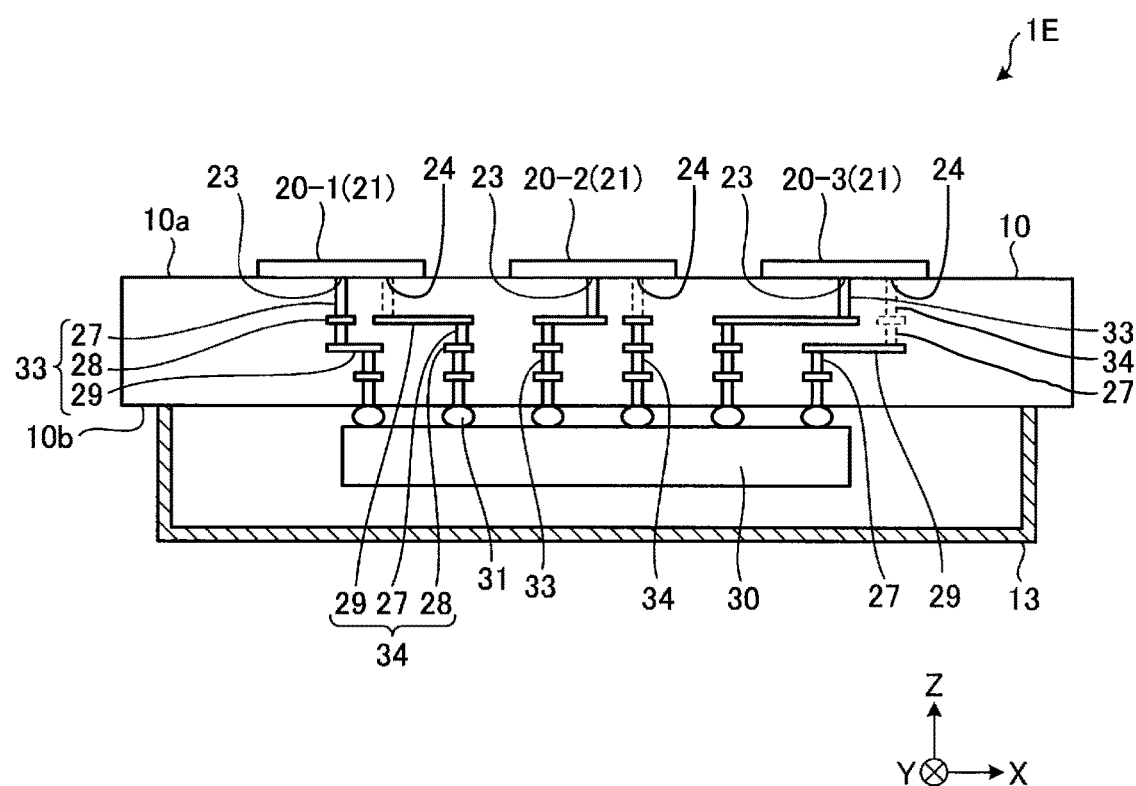
FIG. 14 is a sectional view illustrating an antenna module according to a second modification of the third embodiment.

FIG. 14 is a sectional view illustrating an antenna module according to a second modification of the third embodiment. Unlike the third embodiment and the first modification, which have been described above, a configuration in which a shield member 13 is provided will be described in the second modification of the third embodiment. As illustrated in FIG. 14, the shield member 13 is provided on the second surface 10b of the base member 10 so as to cover the control circuit 30. The shield member 13 is made of a metal material having electrical conductivity and is connected to a ground potential of the base member 10. As a result, the shield member 13 electromagnetically shields the control circuit 30. The shield member 13 includes a flat plate that faces the second surface 10b and a side plate that surrounds the control circuit 30. In an antenna module 1E that has such a configuration, the control circuit 30 is protected by the shield member 13, and interference between signals radiated by the antennas 20 and the control circuit 30 can be suppressed. Note that, although the interior of the shield member 13 is hollow, the present disclosure is not limited to this configuration. For example, the sealing resin 11 may be provided in the interior of the shield member 13.

Note that the configuration according to the second modification of the third embodiment can also be applied to the antenna modules 1 and 1A to 1E of the first to third embodiments and the first and the second modifications of the third embodiment.

Figure 15:
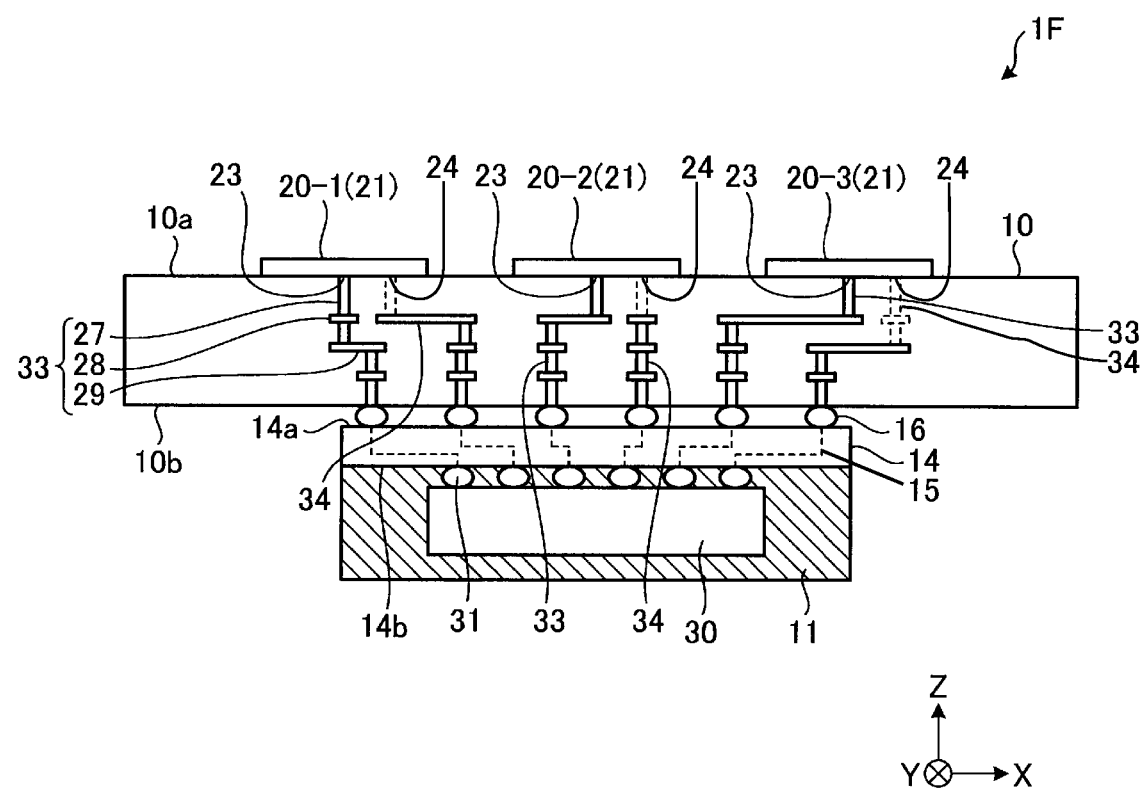
FIG. 15 is a sectional view illustrating an antenna module according to a third modification of the third embodiment.

FIG. 15 is a sectional view illustrating an antenna module according to a third modification of the third embodiment. Unlike the third embodiment and the first and second modifications of the third embodiment, which have been described above, a configuration in which a circuit board 14 is provided will be described in the third modification of the third embodiment. As illustrated in FIG. 14, the circuit board 14 has a first surface 14a and a second surface 14b that is opposite to the first surface 14a. The first surface 14a of the circuit board 14 is positioned so as to face the second surface 10b of the base member 10. The circuit board 14 and the base member 10 are electrically connected to each other via connection terminals 16. The circuit board 14 has a plurality of signal paths 15, and the first feed lines 33 and the second feed lines 34 of the base member 10 are connected to the signal paths 15 by the connection terminals 16.

The control circuit 30 is mounted on the second surface 14b of the circuit board 14, that is, the surface of the circuit board 14 that is opposite to the surface of the circuit board 14 facing the base member 10. As a result, the first feed lines 33 and the second feed lines 34 are electrically connected to the control circuit 30 via the plurality of signal paths 15 of the circuit board 14. The sealing resin 11 is provided on the second surface 14b of the circuit board 14 so as to cover the control circuit 30.

The thickness of the circuit board 14 is smaller than the thickness of the base member 10. As a result, a wider bandwidth of each of the antennas 20 can be achieved while an increase in the entire thickness of an antenna module 1F is suppressed. In addition, the arrangement pitch of the connection terminals 31 of the control circuit 30 and the arrangement pitch of the connection terminals 16 of the circuit board 14 are different from each other. Thus, the antenna module 1F can improve the degree of freedom in arranging the connection terminals 31 of the control circuit 30 and the degree of freedom in routing the first feed lines 33 and the second feed lines 34. In other words, even in the case of changing routing of the first feed lines 33 and the second feed lines 34, by changing the connection terminals 16 and the signal paths 15 of the circuit board 14, the connection terminals 31 of the control circuit 30 do not need to be changed. Alternatively, even in the case of changing the arrangement of the connection terminals 31 of the control circuit 30, by changing the circuit board 14 in accordance with the control circuit 30, the first feed lines 33 and the second feed lines 34 of the base member 10 do not need to be changed.

Note that the configuration according to the third modification of the third embodiment can also be applied to the antenna modules 1 and 1A to 1E of the first to third embodiments and the first to third modifications of the third embodiment.

Figure 16:
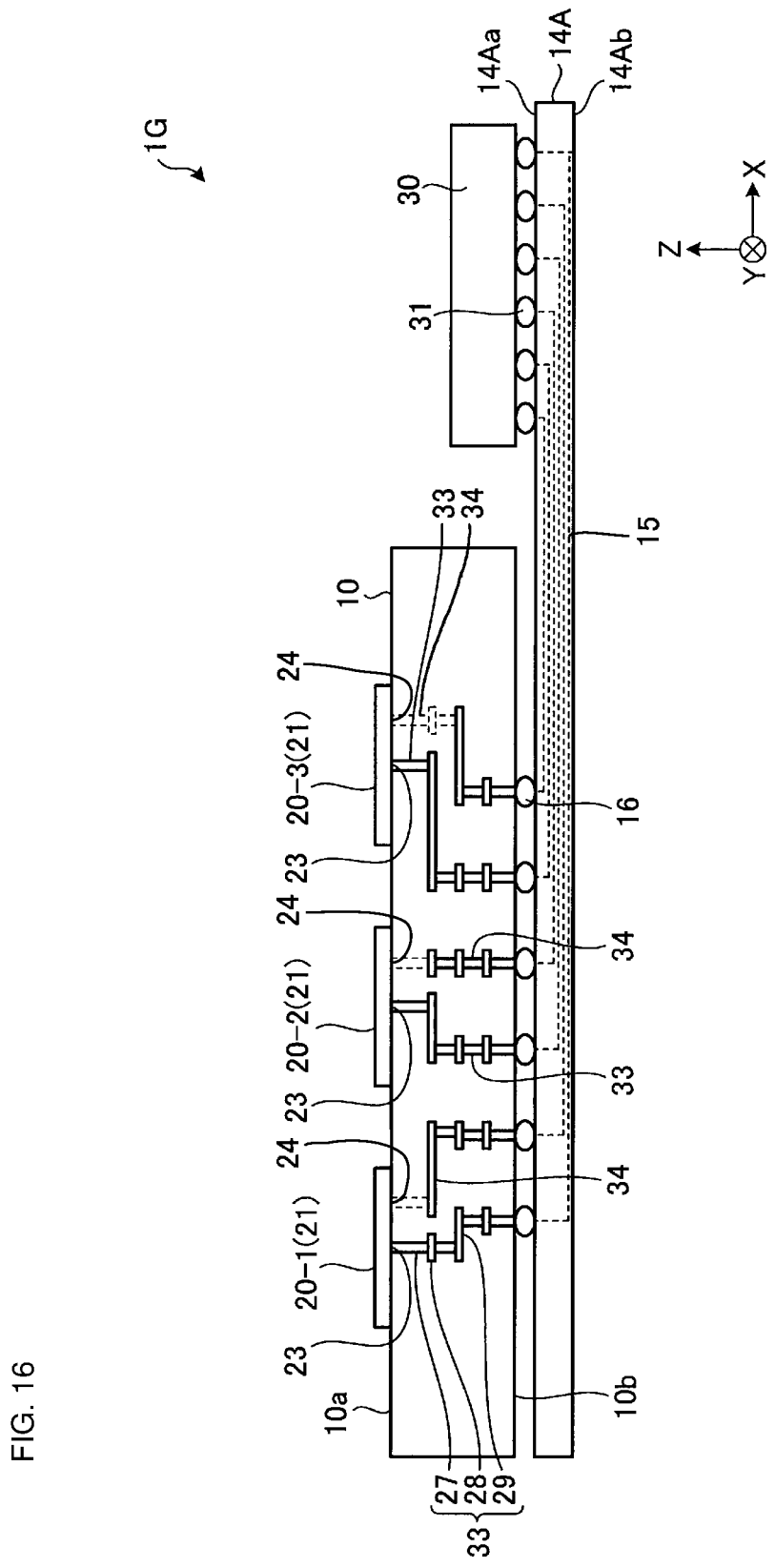
FIG. 16 is a sectional view illustrating an antenna module according to a fourth modification of the third embodiment.

FIG. 16 is a sectional view illustrating an antenna module according to a fourth modification of the third embodiment. Unlike the third embodiment and the first to third modifications of the third embodiment, which have been described above, a configuration in which the control circuit 30 and the base member 10 are mounted on the same surface of a circuit board 14A will be described in the fourth modification of the third embodiment. As illustrated in FIG. 16, the circuit board 14A has an area larger than that of the base member 10 when viewed in plan view. The control circuit 30 and the base member 10 are mounted on a first surface 14Aa of the circuit board 14A. No circuit or component is mounted on a second surface 14Ab of the circuit board 14A. The first feed lines 33 and the second feed lines 34 are electrically connected to the control circuit 30 via the signal paths 15 of the circuit board 14A. With such a configuration, since the control circuit 30 and the base member 10 are mounted on the same surface of the circuit board 14A in a process of manufacturing an antenna module 1G, the process of mounting the control circuit 30 and the base member 10 can be easily performed.

Note that the configuration according to the fourth modification of the third embodiment can also be applied to the antenna modules 1 and 1A to 1E of the first to third embodiments and the first to third modifications of the third embodiment.

Fourth Embodiment

Figure 17:
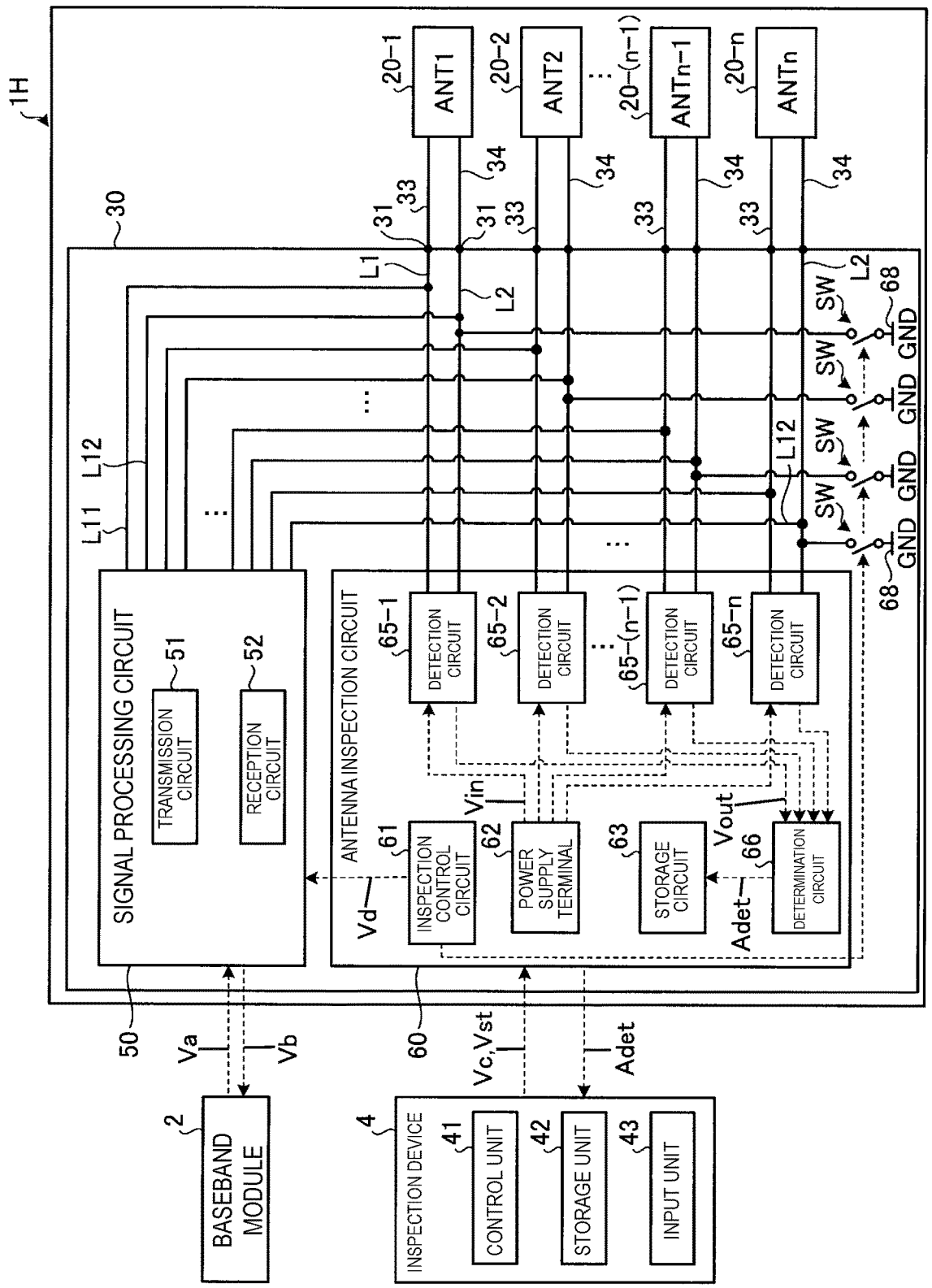
FIG. 17 is a block diagram illustrating a configuration example of an antenna module according to a fourth embodiment.

FIG. 17 is a block diagram illustrating a configuration example of an antenna module according to a fourth embodiment. Unlike the first to third embodiments, which have been described above, in the fourth embodiment, a configuration in which the first connection wiring lines L1 and L2 and the second connection wiring lines L11 and L12 are provided so as to be connectable to ground terminals 68 will be described. As illustrated in FIG. 17, the control circuit 30 includes the ground terminals 68 and switches SW. Each of the switches SW performs, on the basis of a control signal from the inspection control circuit 61, a switching operation for connecting and disconnecting one of the first connection wiring lines L2 and one of the ground terminals 68. A first end of each of the switches SW is connected to a portion of one of the first connection wiring lines L2, the portion being located between a position where the first connection wiring line L2 and a corresponding one of the second connection wiring lines L12 are connected to each other and one of the detection circuits 65. A second end of each of the switches SW is connected to the corresponding ground terminal 68. For example, the ground terminals 68 are electrically connected to a ground layer of the base member 10. All the first connection wiring lines L2, each of which corresponds to one of the antennas 20, are connectable to the ground terminals 68 via the switches SW. Note that the first ends of the switches SW may be connected to the first connection wiring lines L1.

With such a configuration, for example, the control circuit 30 switches on the switches SW after the process in the inspection mode that is illustrated in FIG. 6 has been terminated. As a result, the first connection wiring lines L1 and L2 and the second connection wiring lines L11 and L12 are electrically connected to the ground terminals 68. The static electricity accumulated in the first connection wiring lines L1 and L2 and the second connection wiring lines L11 and L12 during the inspection mode flows to the ground layer via the switches SW and the ground terminals 68. As a result, an antenna module 1H suppresses the electrification of the first connection wiring lines L1 and L2 and the second connection wiring lines L11 and L12 and can take measures against electrostatic discharge (ESD). In the communication mode, the control circuit 30 switches off the switches SW. As a result, the first connection wiring lines L1 and L2 and the second connection wiring lines L11 and L12 are disconnected from the ground terminals 68.

Figure 18:
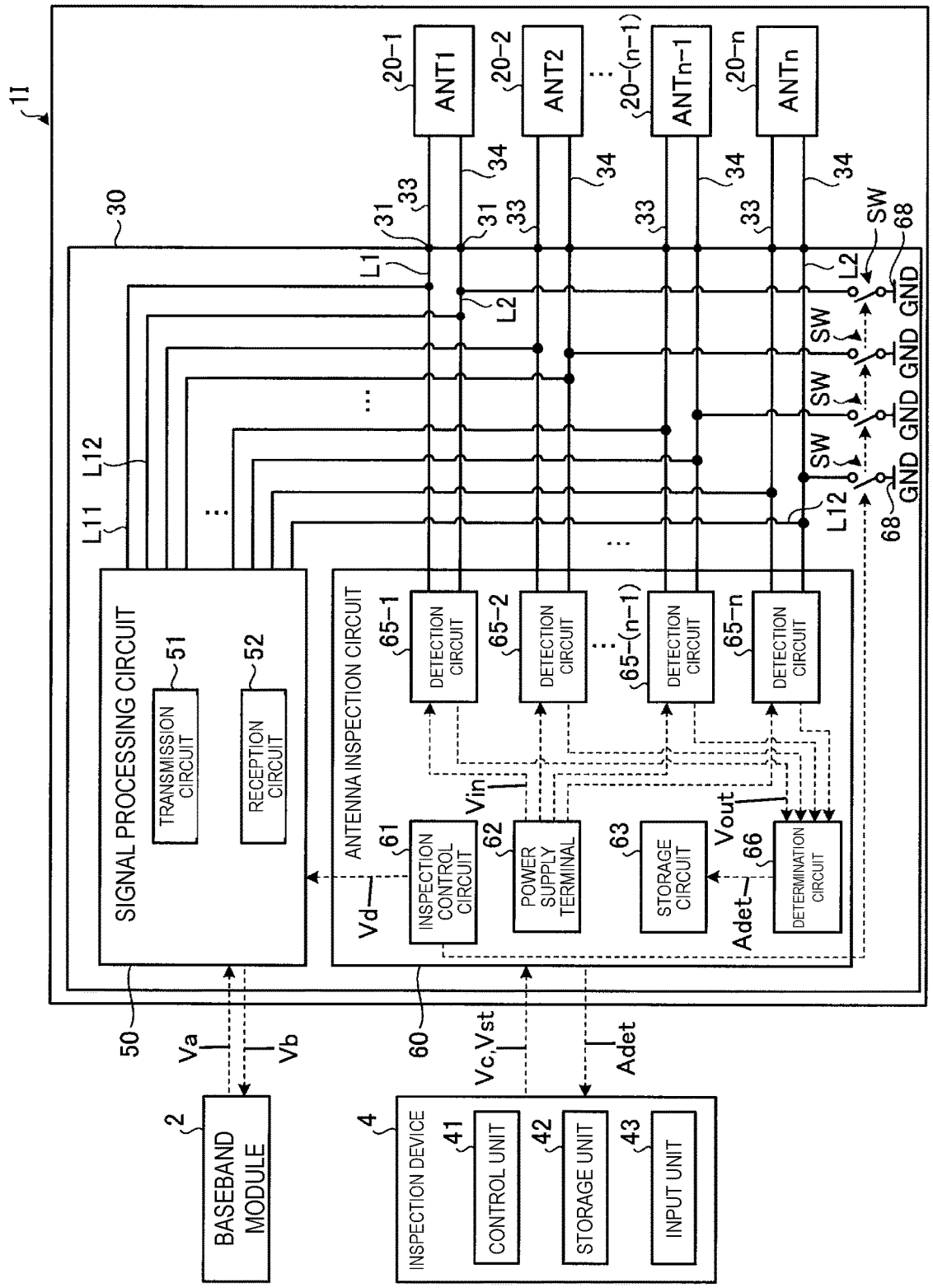
FIG. 18 is a block diagram illustrating a configuration example of an antenna module according to a first modification of the fourth embodiment.

FIG. 18 is a block diagram illustrating a configuration example of an antenna module according to a first modification of the fourth embodiment. Unlike the above-described fourth embodiment, in the first modification of the fourth embodiment, a configuration will be described in which the first end of each of the switches SW is connected to a portion of one of the first connection wiring lines L2, the portion being located between a position where the first connection wiring line L2 and a corresponding one of the second connection wiring lines L12 are connected to each other and one of the connection terminals 31 to which one of the second feed lines 34 is connected. Even in such a configuration, the static electricity accumulated in the first connection wiring lines L1 and L2 and the second connection wiring lines L11 and L12 during the inspection mode flows to the ground layer via the switches SW and the ground terminals 68. As a result, an antenna module 1I can take measures against ESD. Note that the first end of each of the switches SW may be connected to a portion of one of the first connection wiring lines L1, the portion being located between a position where the first connection wiring line L1 and a corresponding one of the second connection wiring lines L11 are connected to each other and one of the connection terminals 31 to which one of the first feed lines 33 is connected.

Figure 19:
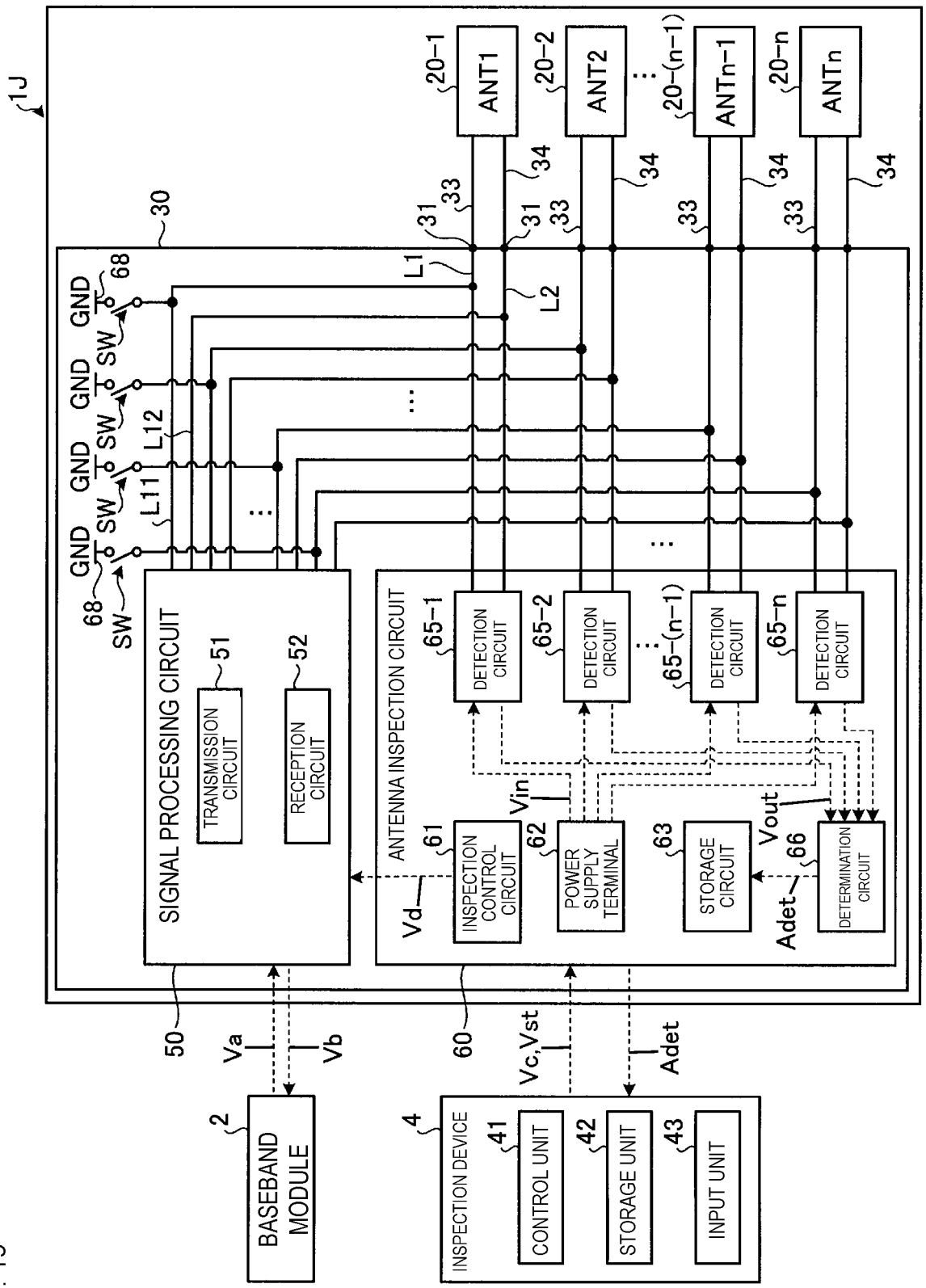
FIG. 19 is a block diagram illustrating a configuration example of an antenna module according to a second modification of the fourth embodiment.

FIG. 19 is a block diagram illustrating a configuration example of an antenna module according to a second modification of the fourth embodiment. Unlike the fourth embodiment and the first modification of the fourth embodiment, which have been described above, a configuration in which the second connection wiring lines L11 are connected to the ground terminals 68 will be described in the second modification of the fourth embodiment. As illustrated in FIG. 19, the first end of each of the switches SW is connected to one of the second connection wiring lines L11, and the second end of each of the switches SW is connected to one of the ground terminals 68. As a result, each of the switches SW performs a switching operation for connecting and disconnecting one of the second connection wiring lines L11 and a corresponding one of the ground terminals 68. The static electricity accumulated in the first connection wiring lines L1 and L2 and the second connection wiring lines L11 and L12 during the inspection mode flows to the ground layer via the switches SW and the ground terminals 68. As a result, an antenna module 1J can take measures against ESD.

Figure 20:
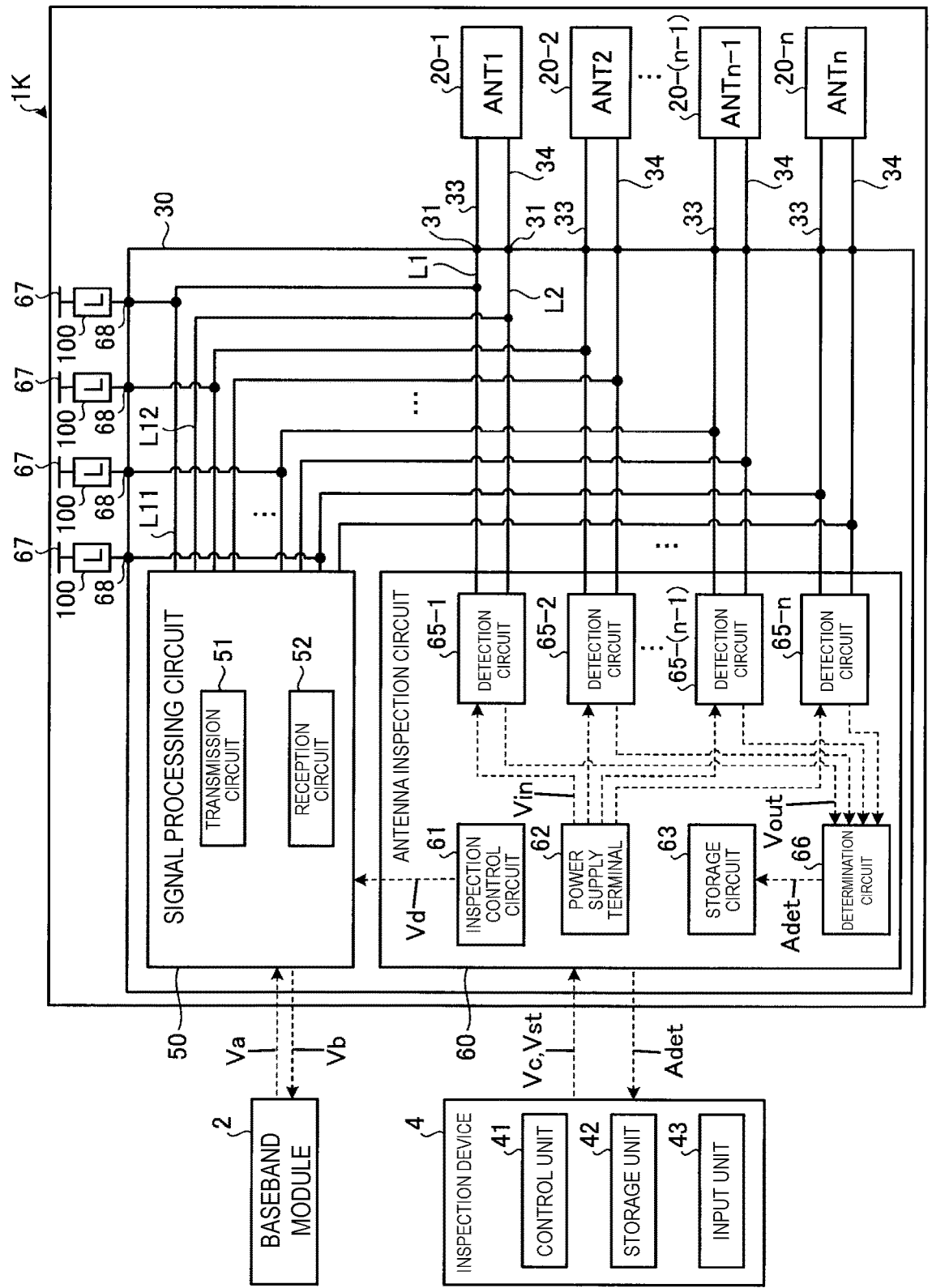
FIG. 20 is a block diagram illustrating a configuration example of an antenna module according to a third modification of the fourth embodiment.

FIG. 20 is a block diagram illustrating a configuration example of an antenna module according to a third modification of the fourth embodiment. Unlike the fourth embodiment and the first and second modifications of the fourth embodiment, which have been described above, a configuration in which the second connection wiring lines L11 are connected to ground layers 67 via inductance elements 100 will be described in the third modification of the fourth embodiment. As illustrated in FIG. 20, the second connection wiring lines L11 are connected to the ground terminals 68. The ground terminals 68 are connected to the ground layers 67 via the inductance elements 100 that are provided outside the control circuit 30. As a result, the plurality of first connection wiring lines L1 and L2 and the plurality of second connection wiring lines L11 and L12 are electrically connected to the ground terminals 68.

The inductance elements 100 may be included in the base member 10 (see FIG. 2) or may be included in the circuit board 14 (see FIG. 15). The inductance elements 100 may be arranged in the control circuit 30. The static electricity accumulated in the first connection wiring lines L1 and L2 and the second connection wiring lines L11 and L12 during the inspection mode flows to the ground layers 67 via the inductance elements 100. As a result, an antenna module 1K can take measures against ESD. The inductance elements 100, each has a sufficiently high impedance with respect to signals that are transmitted by the signal processing circuit 50 and signals that are received by the antennas 20. Thus, in the communication mode, signals that are output by the signal processing circuit 50 and signals that are received by the antennas 20 are not supplied to the ground layers 67.

Note that the inductance elements 100 are not limited to being provided outside the control circuit 30. Similar to the switches SW illustrated in FIG. 19, the inductance elements 100 may be arranged in the control circuit 30.

Note that the configurations according to the fourth embodiment and the modifications of the fourth embodiment can also be applied to the antenna modules 1 and 1A to 1G of the first to third embodiments.

Fifth Embodiment

Figure 21:
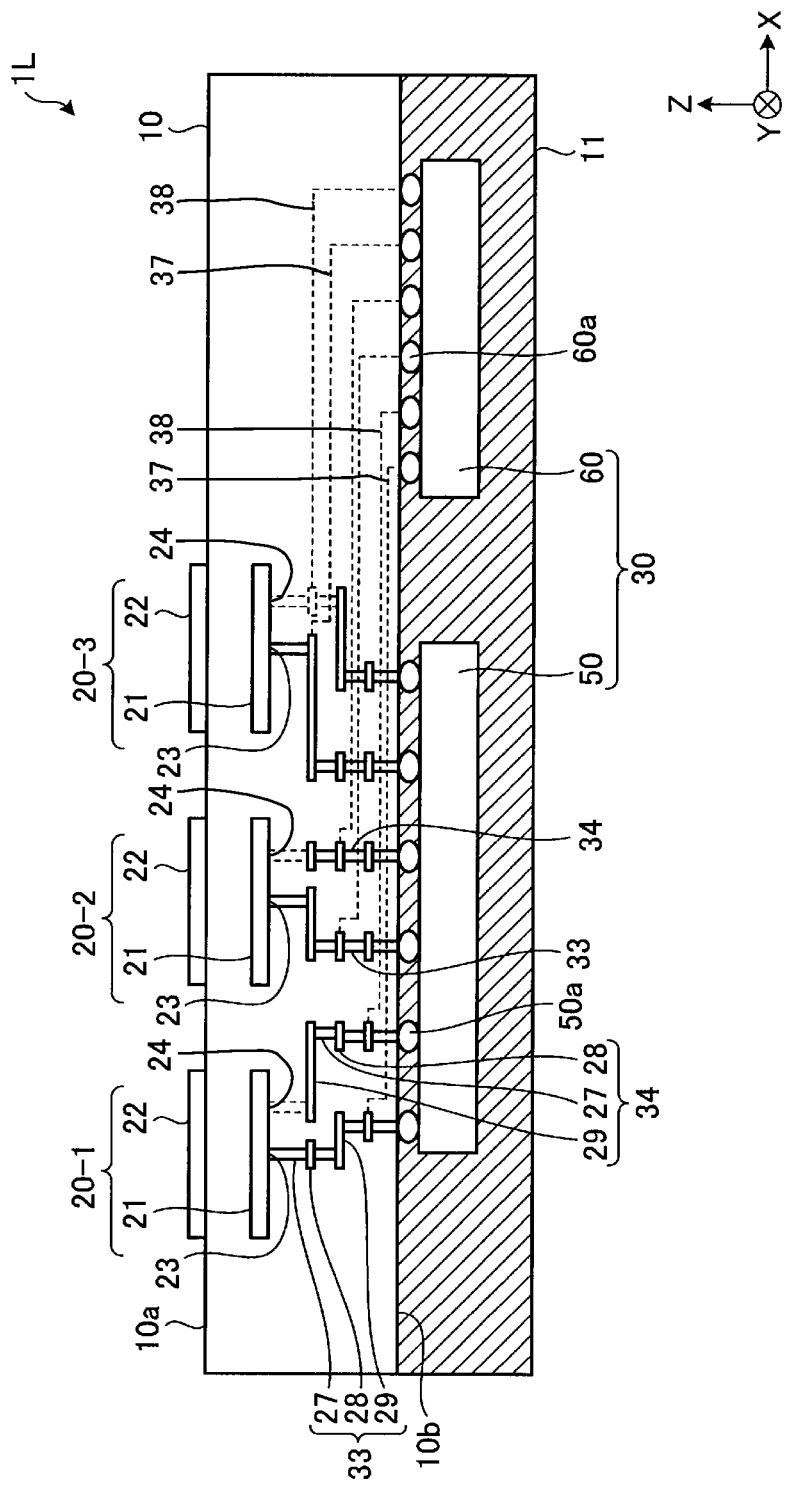
FIG. 21 is a sectional view illustrating an antenna module according to a fifth embodiment.

FIG. 21 is a sectional view illustrating an antenna module according to a fifth embodiment. Unlike the first to fourth embodiments, which have been described above, a configuration in which the signal processing circuit 50 and the antenna inspection circuit 60 are formed of discrete ICs will be described in the fifth embodiment. As illustrated in FIG. 21, in an antenna module 1L, the signal processing circuit 50 and the antenna inspection circuit 60 are arranged on the second surface 10b of the base member 10. The first ends of the first feed lines 33 and the first ends of the second feed lines 34 are each connected to one of the radiating elements 21, and the second ends of the first feed lines 33 and the second ends of the second feed lines 34 are connected to the signal processing circuit 50 via connection terminal 50a. First ends of first connection lines 37 are connected to the first feed lines 33, and second ends of the first connection lines 37 are connected to the antenna inspection circuit 60 via connection terminals 60a. First ends of second connection lines 38 are connected to the second feed lines 34, and second ends of the second connection lines 38 are connected to the antenna inspection circuit 60 via the connection terminals 60a.

Also in such a configuration, the antenna inspection circuit 60 can check the electrical conductivity of each electrical conduction path including the first connection lines 37, the first feed lines 33, the radiating elements 21 of the antennas 20, the second feed lines 34, and the second connection lines 38. In the present embodiment, since the signal processing circuit 50 and the antenna inspection circuit 60 are formed of discrete ICs, each circuit configuration can be easily optimized.

Note that the configuration according to the fifth embodiment can also be applied to the antenna modules 1 and 1A to 1K of the first to fourth embodiments, which have been described above.

REFERENCE SIGNS LIST 1, 1A to 1L antenna module
2 baseband module
4 inspection device
10 base member
10a first surface 10b second surface
11 sealing resin
12 protective layer
13 shield member
14, 14A circuit board
15 signal path
16 connection terminal
20 antenna
21 radiating element
22 passive element
23 first port
24 second port
25 third port
26 fourth port
27 via
28 pad
29 wiring line
30 control circuit
31 connection terminal
33 first feed line
34 second feed line
35 third feed line
36 fourth feed line
41 control unit
42 storage unit
43 input unit
50 signal processing circuit
51 transmitting circuit
52 receiving circuit
60 antenna inspection circuit
61 inspection control circuit
62 power supply terminal
63 storage circuit
64 connection switching circuit
65 detection circuit
66 determining circuit

The invention claimed is:

1. An antenna module comprising:
a base member;
an antenna comprising a radiating element in or on the base member;
a first feed line and a second feed line that are connected to the radiating element; and
a control circuit that is connected to the radiating element via the first feed line and the second feed line,
wherein the control circuit comprises:
  a signal processing circuit that is connected to the antenna via the first feed line and the second feed line, and
  an antenna inspection circuit configured to check an electrical conductivity of an electrical conduction path, the electrical conduction path connecting the first feed line, the radiating element, and the second feed line to each other.

2. The antenna module according to claim 1, wherein:
the control circuit is configured to selectively switch an operating mode of the antenna module between a communication mode and an inspection mode,
when the antenna module operates in the communication mode, transmission and reception of a signal via the antenna is performed by an operation of the signal processing circuit, and
when the antenna module operates in the inspection mode, the electrical conductivity of the electrical conduction path is checked by an operation of the antenna inspection circuit.

3. The antenna module according to claim 1, wherein the antenna inspection circuit comprises:
a detection circuit configured to detect output signals from the first feed line, the radiating element, and the second feed line, and
a determination circuit configured to determine the electrical conductivity of the electrical conduction path based on the output signals.

4. The antenna module according to claim 1,
wherein a plurality of the antennas are in or on the base member, and
wherein the antenna inspection circuit is configured to sequentially check the electrical conductivity of a plurality of electrical conduction paths for the plurality of antennas, and to output inspection results of all antennas that have been checked.

5. The antenna module according to claim 1,
wherein a plurality of the antennas are in or on the base member, and
wherein the antenna inspection circuit is configured to sequentially check the electrical conductivity of a plurality of electrical conduction paths for the plurality of antennas, and to terminate the electrical conductivity check when an electrical conduction abnormality is detected from at least one of the antennas.

6. The antenna module according to claim 1, wherein the radiating element is in or on an inner layer of the base member.

7. The antenna module according to claim 6, wherein the antenna further comprises a parasitic element that is in or on a surface of the base member, and that faces the radiating element.

8. The antenna module according to claim 1, wherein the radiating element is a patch antenna that has a first port to which the first feed line is connected and a second port to which the second feed line is connected, and the antenna is configured to transmit and receive either or both of a polarized wave radiated as a result of a high-frequency signal supplied to the first port and a polarized wave radiated as a result of a high-frequency signal supplied to the second port.

* * * * *